United States Patent
Nagao et al.

(10) Patent No.: US 9,551,474 B2
(45) Date of Patent: Jan. 24, 2017

(54) WAVELENGTH CONVERSION MEMBER, LIGHT SOURCE, AND VEHICLE HEAD LAMP

(71) Applicant: Panasonic Intellectual Property Management Co., Ltd., Osaka (JP)

(72) Inventors: Nobuaki Nagao, Gifu (JP); Seigo Shiraishi, Osaka (JP); Yoshihisa Nagasaki, Osaka (JP); Nobuyasu Suzuki, Osaka (JP); Kazuhiko Yamanaka, Osaka (JP); Kiyoshi Morimoto, Osaka (JP); Takahiro Hamada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 42 days.

(21) Appl. No.: 14/645,462

(22) Filed: Mar. 12, 2015

(65) Prior Publication Data

US 2015/0184830 A1    Jul. 2, 2015

Related U.S. Application Data

(63) Continuation of application No. PCT/JP2014/002966, filed on Jun. 4, 2014.

(30) Foreign Application Priority Data

Jun. 21, 2013  (JP) .................................. 2013-130604
Oct. 8, 2013   (JP) .................................. 2013-210914

(51) Int. Cl.
*F21S 4/00*    (2016.01)
*F21V 3/00*    (2015.01)
(Continued)

(52) U.S. Cl.
CPC .............. *F21V 9/00* (2013.01); *F21S 48/1145* (2013.01); *F21S 48/1241* (2013.01);
(Continued)

(58) Field of Classification Search
CPC ............ F21V 29/70; F21V 29/89; F21V 9/00; F21V 9/16; F21S 48/1145; F21S 48/115; F21S 48/1154; F21S 48/1241; F21S 48/328; H01S 5/005; H01S 33/50; H01S 33/507; H01S 33/644
See application file for complete search history.

(56) References Cited

U.S. PATENT DOCUMENTS

| | | | |
|---|---|---|---|
| 7,422,356 B2 * | 9/2008 | Hama | A61B 1/0653 362/129 |
| 2009/0296018 A1 * | 12/2009 | Harle | G01M 11/062 349/61 |

(Continued)

FOREIGN PATENT DOCUMENTS

| | | |
|---|---|---|
| CN | 102466187 | 5/2012 |
| CN | 102566233 | 7/2012 |

(Continued)

OTHER PUBLICATIONS

English Translation of Chinese Search Report dated Sep. 16, 2015 for the related Chinese Patent Application No. 201480002277.6.
(Continued)

*Primary Examiner* — Andrew Coughlin
*Assistant Examiner* — Alexander Garlen
(74) *Attorney, Agent, or Firm* — McDermott Will & Emery LLP

(57) ABSTRACT

A wavelength conversion member includes: a heat conducting layer; a sapphire substrate having a third surface directly contact with a second surface of the heat conducting layer and the fourth surface opposite to the third surface; and a
(Continued)

phosphor layer having a fifth surface directly contact with the fourth surface and a sixth surface opposite to the fifth surface, the phosphor layer including phosphor. At least one of an area of a first surface and an area of the second surface of the heat conducting layer is at least 2800 times as large as an area of the sixth surface of the phosphor layer. At least one of an area of the third surface and an area of the fourth surface of the sapphire substrate is at least two times as large as the area of the sixth surface of the phosphor layer.

12 Claims, 16 Drawing Sheets

(51) Int. Cl.
*F21V 5/00* (2015.01)
*F21V 21/30* (2006.01)
*F21V 9/00* (2015.01)
*F21S 8/10* (2006.01)
*F21V 29/70* (2015.01)
*F21V 29/89* (2015.01)
*H01S 5/00* (2006.01)
*H01L 33/50* (2010.01)
*H01L 33/64* (2010.01)
*F21V 9/16* (2006.01)
*F21Y 101/00* (2016.01)

(52) U.S. Cl.
CPC ............ *F21S 48/328* (2013.01); *F21V 29/70* (2015.01); *F21V 29/89* (2015.01); *H01S 5/005* (2013.01); *F21K 9/61* (2016.08); *F21K 9/64* (2016.08); *F21V 9/16* (2013.01); *F21Y 2101/00* (2013.01); *F21Y 2115/30* (2016.08); *H01L 33/50* (2013.01); *H01L 33/507* (2013.01); *H01L 33/644* (2013.01)

(56) References Cited

U.S. PATENT DOCUMENTS

| | | | |
|---|---|---|---|
| 2010/0254153 A1* | 10/2010 | Hama | A61B 1/0653 362/551 |
| 2011/0141763 A1* | 6/2011 | Kamee | G02B 6/0008 362/583 |
| 2012/0026721 A1* | 2/2012 | Kurt | F21K 9/56 362/84 |
| 2012/0057325 A1* | 3/2012 | Hikmet | H01L 33/58 362/19 |
| 2012/0106188 A1 | 5/2012 | Takahashi et al. | |
| 2012/0154767 A1 | 6/2012 | Kimura et al. | |
| 2012/0236536 A1 | 9/2012 | Harada | |
| 2013/0083296 A1 | 4/2013 | Ogura | |

FOREIGN PATENT DOCUMENTS

| | | |
|---|---|---|
| CN | 102691905 | 9/2012 |
| JP | 2013-004479 | 1/2013 |
| JP | 2013-073220 | 4/2013 |
| JP | 2013-089469 | 5/2013 |
| WO | 2010/049875 | 5/2010 |

OTHER PUBLICATIONS

International Search Report of PCT application No. PCT/JP2014/002966 dated Sep. 9, 2014.
The Extended European Search Report dated May 4, 2016 for the related European Patent Application No. 14813327.5.

* cited by examiner

WAVELENGTH CONVERSION MEMBER, LIGHT SOURCE, AND VEHICLE HEAD LAMP

BACKGROUND

1. Technical Field

The present disclosure relates to a wavelength conversion member that converts light, a light source having the wavelength conversion member, and a vehicle head lamp having the light source.

2. Description of the Related Art

There is a known head lamp including a semiconductor laser device, a light emitting section that emits light by laser light emitted from the semiconductor laser device, a heat conducting member that has a light emitting section facing surface that faces the light emitting section and receives the heat of the light emitting section through the light emitting section facing surface, and a gap layer, provided between the light emitting section and the light emitting section facing surface, that conducts the heat of the light emitting section to the light emitting section facing surface, in which the gap layer includes at least an inorganic amorphous material (see Japanese Unexamined Patent Application Publication No. 2013-4479, for example).

SUMMARY

However, the related art is requested to further improve the emission efficiency or reliability.

One non-limiting and exemplary embodiment provides a wavelength conversion member that improves at least one of the emission efficiency and reliability.

In one general aspect, the techniques disclosed here feature a wavelength conversion member including: a heat conducting layer having a first surface and a second surface opposite to the first surface; a sapphire substrate having a third surface directly contact with the second surface of the heat conducting layer and the fourth surface opposite to the third surface; and a phosphor layer having a fifth surface directly contact with the fourth surface and a sixth surface opposite to the fifth surface, the phosphor layer including phosphor that converts first light having a first wavelength into second light having a second wavelength longer than the first wavelength. At least one of an area of the first surface and an area of the second surface of the heat conducting layer is at least 2800 times as large as an area of the sixth surface of the phosphor layer. At least one of an area of the third surface and an area of the fourth surface of the sapphire substrate is at least two times as large as the area of the sixth surface of the phosphor layer.

The wavelength conversion member according to the present disclosure can improve at least one of the emission efficiency and reliability. It should be noted that general or specific embodiments may be implemented as a member, a light source, a head lamp, a device, an apparatus, a system, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
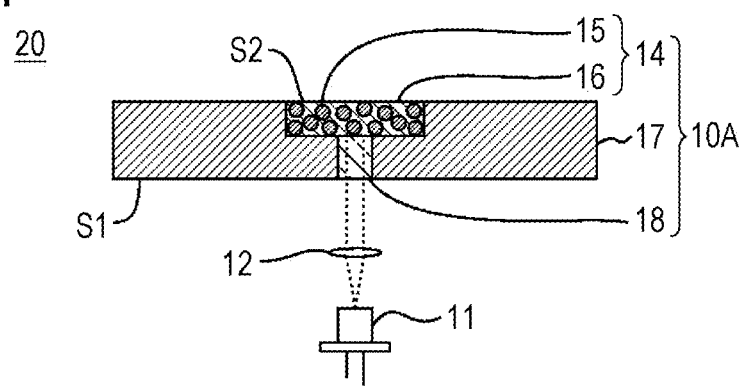
FIG. 1 is a schematic view showing a light source according to a first embodiment.

A wavelength conversion member according to a first aspect of the present disclosure includes a heat conductor, a light guide path and a wavelength converter. The heat conductor has a recessed portion and an opening extending through the heat conductor. The light guide path includes a transparent material with which the opening is filled. The light guide path includes a light exit port disposed on a side of the recessed portion and a light incident port disposed on a side opposite to the recessed portion. The wavelength converter converts first light having a first peak wavelength incident through the light guide path into second light having a second peak wavelength different from the first peak wavelength. The wavelength converter is disposed in contact with the heat conductor, at least a part of the wavelength converter being embedded in the recessed portion. An area of a portion of the wavelength converter in contact with the heat conductor is larger than an area of the light exit port of the light guide path. The transparent material has a larger thermal conductivity than air. The heat conductor may reflect at least a part of visible light. The heat conductor may have a visible light reflectivity of 0.8 or more.

A wavelength conversion member according to a second aspect of the present disclosure is the wavelength conversion member according to the first aspect in which an area of a surface of the heat conductor opposite to the wavelength converter may be at least 2800 times as large as an area of a surface of the wavelength converter opposite to the heat conductor.

A wavelength conversion member according to a third aspect of the present disclosure is the wavelength conversion member according to the first or second aspect in which the heat conductor has a thermal conductivity of more than 20 W/(m·K).

A wavelength conversion member according to a fourth aspect of the present disclosure is the wavelength conversion member according to any one of the first to third aspects in which the heat conductor may be made of metal.

A wavelength conversion member according to a fifth aspect of the present disclosure is the wavelength conversion member according to any one of the first to fourth aspects in which the heat conductor may be made of aluminum or alloy including aluminum.

A wavelength conversion member according to a sixth aspect of the present disclosure is the wavelength conversion member according to any one of the first to fifth aspects in which the transparent material may be an inorganic transparent material.

A wavelength conversion member according to a seventh aspect of the present disclosure is the wavelength conversion member according to the sixth aspect in which the inorganic transparent material has a thermal conductivity of more than 20 W/(m·K).

A wavelength conversion member according to an eighth aspect of the present disclosure is the wavelength conversion member according to the sixth or seventh aspect in which the inorganic transparent material may be zinc oxide.

A wavelength conversion member according to a ninth aspect of the present disclosure is the wavelength conversion member according to any one of the first to eighth aspects in which an area of a surface of the wavelength converter opposite to the light guide path may be larger than an area of a surface of the wavelength converter close to the light guide path and a side surface of the wavelength converter may be tapered and slanted.

A wavelength conversion member according to an tenth aspect of the present disclosure is the wavelength conversion member according to any one of the first to eighth aspects in which the wavelength converter may be parabolic.

A wavelength conversion member according to an eleventh aspect of the present disclosure is the wavelength conversion member according to any one of the first to tenth aspects that may further include a dichroic mirror placed on a surface of the wavelength converter opposite to the light guide path, the dichroic mirror transmitting the second light and reflecting the first light.

A wavelength conversion member according to a twelfth aspect of the present disclosure is the wavelength conversion member according to any one of the first to eleventh aspects that may further include a dichroic mirror placed on a surface of the wavelength converter close to the light guide path, the dichroic mirror transmitting the first light and reflecting the second light.

A wavelength conversion member according to a thirteenth aspect of the present disclosure is the wavelength conversion member according to any one of the first to eleventh aspects that may further include a dichroic mirror placed on a side of an incident port of the light guide path, the dichroic mirror transmitting the first light and reflecting the second light.

A light source according to a fourteenth aspect of the present disclosure includes the wavelength conversion member according to any one of the first to thirteenth aspects and a semiconductor light emitting device that generates light incident on the incident port of the light guide path.

A vehicle head lamp according to a fifteenth aspect of the present disclosure includes the light source according to the fourteenth aspect and an emitting optical system that guides light from the light source to the front.

A wavelength conversion member according to a sixteenth aspect of the present disclosure is a wavelength conversion member including phosphor that converts light from a semiconductor light emitting device into light with a longer wavelength and includes one or more wavelength conversion layers and heat conducting layers, in which an area of a front surface or an area of a back surface of the heat conducting layer is at least 2800 times as large as a photoreception area of the wavelength conversion layer.

A wavelength conversion member according to a seventeenth aspect of the present disclosure is the wavelength conversion member according to the sixteenth aspect in which the area of the front surface or the area of the back surface of the heat conducting layer is at least 8000 times as large as the photoreception area of the wavelength conversion layer.

A wavelength conversion member according to a eighteenth aspect of the present disclosure is the wavelength conversion member according to the sixteenth or seventeenth aspect in which the wavelength conversion layer includes a plurality of types of layers and at least one of the plurality of types of layers of the wavelength conversion layer does not include a resin binder.

A wavelength conversion member according to a nineteenth aspect of the present disclosure is the wavelength conversion member according to any one of the sixteenth to eighteenth aspects in which the heat conducting layer is transparent in a visible region and has a thermal conductivity of 30 W/(m·K) or more.

A wavelength conversion member according to a twentieth aspect of the present disclosure is the wavelength conversion member according to any one of the sixteenth to nineteenth aspects in which the heat conducting layer has a thermal conductivity of 42 W/(m·K) or more.

A wavelength conversion member according to a twenty-first aspect of the present disclosure is the wavelength conversion member according to any one of the sixteenth to twentieth aspects in which the heat conducting layer has a thermal conductivity of 230 W/(m·K) or more.

A wavelength conversion member according to a twenty-second aspect of the present disclosure is the wavelength conversion member according to any one of the sixteenth to twenty-first aspects in which the wavelength conversion layer includes a plurality of types of layers and at least one of the plurality of types of layers of the wavelength conversion layer is a sapphire substrate disposed in contact with the heat conducting layer.

A wavelength conversion member according to a twenty-third aspect of the present disclosure is the wavelength conversion member according to any one of the sixteenth to twenty-first aspects in which the wavelength conversion layer includes a phosphor layer having glass or a transparent crystal in which phosphor is distributed and a sapphire substrate.

A wavelength conversion member according to a twenty-fourth aspect of the present disclosure is the wavelength conversion member according to the twenty-second or twenty-third aspect in which an area of a contact surface between the sapphire substrate and another layer of the wavelength conversion layer facing the sapphire substrate or an area of a contact surface between the sapphire substrate and the heat conducting layer facing the sapphire substrate is equal to a photoreception area of the wavelength conversion layer for receiving light from a semiconductor light emitting device.

A wavelength conversion member according to a twenty-fifth aspect of the present disclosure is the wavelength conversion member according to the twenty-second or twenty-third aspect in which a ratio of an area of a contact surface between the sapphire substrate and another layer of the wavelength conversion layer facing the sapphire substrate or an area of a contact surface between the sapphire substrate and the heat conducting layer facing the sapphire substrate to a photoreception area of the wavelength conversion layer for receiving light from a semiconductor light emitting device is 3.1 or more.

A wavelength conversion member according to a twenty-sixth aspect of the present disclosure is the wavelength conversion member according to any one of the twenty-second to twenty-fifth aspects in which the area of the sapphire substrate is twice or more larger than the photoreception area.

A wavelength conversion member according to a twenty-seventh aspect of the present disclosure is the wavelength conversion member according to any one of the twenty-second to twenty-sixth aspects in which the sapphire substrate is a sapphire single-crystal substrate.

A wavelength conversion member according to a twenty-eighth aspect of the present disclosure is the wavelength conversion member according to any one of the sixteenth to twenty-seventh aspects in which the heat conducting layer is a reflecting body with respect to visible light and has a thermal conductivity of 237.5 W/(m·K) or more.

A light source according to a twenty-ninth aspect of the present disclosure includes the wavelength conversion member according to any one of the sixteenth to twenty-eighth aspects.

A vehicle head lamp according to a thirtieth aspect of the present disclosure includes the light source according to the twenty-ninth aspect.

First Embodiment

FIG. 1 is a schematic view showing a light source 20 according to a first embodiment. The light source 20 according to the present embodiment includes a wavelength conversion member 10A and a semiconductor light emitting device 11. The semiconductor light emitting device 11 can be, for example, a light emitting diode (LED), a super luminescent diode (SLD), or a laser diode (LD). The semiconductor light emitting device 11 may be one LED, SLD, or LD or may be an optical combination of a plurality of LEDs, SLDs, or LDs. Light emitted from the semiconductor light emitting device 11 may be blue-violet light, blue light, or light with another wavelength. The semiconductor light emitting device 11 may emit light with a plurality of wavelengths. As an example, the present embodiment assumes that the semiconductor light emitting device 11 is an LD.

In the present disclosure, blue-violet light has a peak wavelength of at least 380 nm and at most 420 nm. Blue light has a peak wavelength of more than 420 nm and at most 480 nm. Yellow light has a peak wavelength of at least 540 nm and at most 590 nm.

An incident optical system 12 that guides light from the semiconductor light emitting device 11 to the wavelength conversion member 10A may be provided between the wavelength conversion member 10A and the semiconductor light emitting device 11. The incident optical system 12 may include at least one of, for example, a lens, mirror, and optical fiber.

The wavelength conversion member 10A according to the present embodiment includes a wavelength conversion section 14, a heat conducting section 17, and a light guide path 18 extending through the heat conducting section 17. In the following description, the side of the wavelength conversion member 10A that faces the semiconductor light emitting device 11 is referred to as the rear and the side opposite to the semiconductor light emitting device 11 is referred to as the front. The surface on the front side of the wavelength conversion section 14 and the heat conducting section 17 may be referred to as the front surface and the surface on the rear side may be referred to as the rear surface.

The wavelength conversion section 14 converts first light from the semiconductor light emitting device 11 into second light with a different wavelength. The wavelength conversion section 14 is a layer including phosphor that, for example, is excited by incident light and emits fluorescent light with a longer wavelength than the incident light. In this case, light from the semiconductor light emitting device 11 is converted into light with a longer wavelength. Each of the first light and the second light may be light with one wavelength or may be mixed light including light with a plurality of wavelengths. For example, when white light is generated, if the first light is blue-violet light, the second light may be yellow light and blue light. When the first light is blue light, the second light may be yellow light. The wavelength conversion section 14 may include, for example, phosphor powder 15 including many phosphor particles and a binder 16.

The type of phosphor may be selected depending on the wavelength of incident light and the required wavelength of emitted light as appropriate. For example, when the semiconductor light emitting device 11 emits blue-violet light, the wavelength conversion section 14 may include, for example, a yellow phosphor and blue phosphor to generate white light. In the present disclosure, a yellow phosphor has an emission spectrum peak wavelength of at least 540 nm and at most 590 nm. In the present disclosure, a blue phosphor has an emission spectrum peak wavelength of more than 420 nm and at most 480 nm. When the semiconductor light emitting device 11 emits blue light, the wavelength conversion section 14 may include, for example, a yellow phosphor.

The binder 16 is disposed between the particles of the phosphor powder 15 to bond the phosphor powder 15 together. The binder 16 may be, for example, an inorganic material. The binder 16 may be a medium such as glass or a transparent crystal. However, the wavelength conversion section 14 does not need to include the binder 16 and may be, for example, a phosphor sintered body such as phosphor ceramic.

The wavelength conversion section 14 does not need to consist of a single layer. The wavelength conversion section 14 may include a plurality of layers laminated together. When the wavelength conversion section 14 includes a plurality of layers, each of the layers may include a different type of phosphor. When the wavelength conversion section 14 includes a plurality of layers, the binder 16 included in the layer closest to the heat conducting section 17 may be an inorganic material. In this case, the binder 16 in other layers may be an organic material such as resin.

The heat conducting section 17 is provided between the wavelength conversion section 14 and the semiconductor light emitting device 11. The heat conducting section 17 makes contact with at least the rear surface of the wavelength conversion section 14. "The heat conducting section 17 is in contact with the wavelength conversion section 14" in the present disclosure means not only that the two members are directly in contact with each other so as to conduct heat, but also that the two members are indirectly in contact with each other via a solid layer that conducts heat. A solid layer that conducts heat includes a metal layer, silicon layer, silicon carbide layer, diamond layer, or the like. In addition, a heat conductive paste is also included.

In FIG. 1, the wavelength conversion section 14 is embedded in a recessed portion provided in the heat conducting section 17. The heat conducting section 17 functions as a heat bath for radiation. Heat generated in the wavelength conversion section 14 is conducted to the heat conducting section 17 and radiated. Accordingly, the heat conducting section 17 may have a large thermal conductivity. The heat conducting section 17 also functions as a reflector that reflects, to the front, light generated by the wavelength conversion section 14 and emitted to the rear. Accordingly, the heat conducting section 17 may have a large light reflectivity.

The heat conducting section 17 may have a thermal conductivity of, for example, more than 20 W/(m·K). Specifically, the heat conducting section 17 may have a thermal conductivity larger than that of sapphire. The heat conducting section 17 may be metal. Specifically, the heat conducting section 17 may be aluminum (thermal conductivity of 237 W/(m·K)), copper (thermal conductivity of 398 W/(m·K)), silver (thermal conductivity of 420 W/(m·K)), or the like. Alternatively, the heat conducting section 17 may be alloy including these metals. Aluminum or aluminum alloy may be used in terms of radiation properties, machinability, and cost. Silicon or the like may be used instead of metal. By increasing the thermal conductivity of the heat conducting section 17, it is possible to suppress rises in the temperature of the wavelength conversion section 14, thereby improving at least one of the emission efficiency and reliability.

The heat conducting section 17 does not need to consist of a single material. For example, a laminated material having a surface coated with a material with a large thermal conductivity may be used. Alternatively, a transparent material may be combined with a material with a large reflectivity. Specifically, a sapphire surface may be coated with metal such as aluminum. A laminated material using bonding or the like instead of coating may be used. The entire heat conducting section 17 may be a laminated material or only a part of the heat conducting section 17 may be a laminated material. For example, a layer with large thermal conductivity may be provided on the portion of the heat conducting section 17 in contact with the wavelength conversion section 14. A layer with large thermal conductivity may be metal such as aluminum, silicon carbide, diamond, or the like. A layer that improves adhesiveness may be provided on the portion of the heat conducting section 17 in contact with the wavelength conversion section 14.

The heat conducting section 17 has a visible light reflectivity of 0.8 or more. By increasing the reflectivity of the heat conducting section 17, light that is generated in the wavelength conversion section 14 and directed to the rear can be directed to the front by reflecting the light efficiently. This improves the use efficiency of light. Visible light in the present disclosure has a wavelength of at least 380 nm and at most 780 nm.

The light guide path 18 is, for example, a through hole that extends through the wavelength conversion section 14 and the light guide path 18 guides light from the semiconductor light emitting device 11 to the wavelength conversion section 14. The light guide path 18 is filled with a material transparent to light from the semiconductor light emitting device 11. A transparent material with a thermal conductivity larger than that of air may be used as the material with which the through hole is filled. A transparent material may be, for example, an inorganic material such as glass or a transparent crystal. A transparent material may also be an organic material such as transparent resin. The through hole is filled with a material with a thermal conductivity larger than that of air, so that the radiation of the wavelength conversion section 14 can be performed more effectively. A material with which the through hole is filled have a thermal conductivity of 1.4 W/(m·K) or more. In terms of radiation, a material with a thermal conductivity larger than that of sapphire is desirable. Specifically, a material with a thermal conductivity larger than 20 W/(m·K) is desirable. Zinc oxide (ZnO) may be used as the material with which the through hole is filled.

In the light guide path 18 in FIG. 1, the area of the incident port on which light from the semiconductor light emitting device 11 is incident is the same as the area of the exit port from which light exits to the side of the wavelength conversion section 14. However, the shape of the light guide path 18 is not limited to this. For example, this may be a tapered shape in which the area of the incident port is larger than the area of the exit port or the area of the incident port is smaller than the area of the exit port. The light guide path 18 may be provided in contact with the wavelength conversion section 14 at the exit port. That is, the transparent material of the light guide path 18 may make contact with the wavelength conversion section 14. This can perform the radiation of the wavelength conversion section 14 more efficiently.

To efficiently reflect light to the front side by enlarging the area in which light is reflected, the area of the portion of the wavelength conversion section 14 in contact with the heat conducting section 17 is desirably large. Also to efficiently conduct heat from the wavelength conversion section 14 to the heat conducting section 17 efficiency, the area of the portion of the wavelength conversion section 14 in contact with the heat conducting section 17 is desirably large. Accordingly, the area of the exit port of the light guide path 18 may be smaller than the area of the portion of the wavelength conversion section 14 in contact with the heat conducting section 17. For example, the area of the exit port of the light guide path 18 can be 50% or less of the area of the portion of the wavelength conversion section 14 in contact with the heat conducting section 17. The area of the exit port may be 30% or less or may be 15% or less. Although no limitation is imposed, to diffuse incident light to the entire wavelength conversion section 14, the area of the incident port or the exit port of the light guide path 18 can be 3% or more of the area of the portion of the wavelength conversion section 14 in contact with the heat conducting section 17. The area of the incident port or the exit port may be 5% or more.

The area $A_{S1}$ of the surface (rear surface) S1 of the heat conducting section 17 opposite to the wavelength conversion section 14 is larger than the area $A_{S2}$ of the surface (front surface) S2 of the wavelength conversion section 14 opposite to the heat conducting section 17. For example, the area ratio ($A_{S1}/A_{S2}$) of the area $A_{S1}$ of the rear surface S1 of the heat conducting section 17 to the area $A_{S2}$ of the front surface S2 of the wavelength conversion section 14 is 2800 or more. Alternatively, the area ratio ($A_{S1}/A_{S2}$) may be 8000 or more. An increase in the area ratio ($A_{S1}/A_{S2}$) suppresses rises in the temperature of the wavelength conversion section 14, thereby improving at least one of the emission efficiency and reliability.

Strictly, the area $A_{S1}/A_{S2}$) of the rear surface S1 of the heat conducting section 17 is the area of the portion excluding the light guide path 18. However, since the area of the light guide path 18 is sufficiently smaller than the area of the rear surface of the heat conducting section 17, the area including the portion of the light guide path 18 can be assumed to be the area $A_{S1}$ of the rear surface S1 of the heat conducting section 17.

The outline of the rear surface of the heat conducting section 17 may have the same size as the outline of the front surface of the heat conducting section 17. However, these outlines do not need to be the same. For example, the heat conducting section 17 may have a tapered shape with a slanted side surface by making the rear surface of the heat conducting section 17 smaller than the front surface. In such a case, the wavelength conversion member 10A can be easily applied and secured to a recessed portion with a tapered shape. A step section may be provided on a side surface of the heat conducting section 17. With this, the wavelength conversion member 10A can be easily secured.

The planar shape of the wavelength conversion section 14 is not limited to a particular shape. The wavelength conversion section 14 may be, for example, rectangular, polygonal, circular, or elliptical. In addition, the planar shape of the heat conducting section 17 is not limited to a particular shape. The heat conducting section 17 may be, for example, rectangular, polygonal, circular, or elliptical. The planar shape of the wavelength conversion section 14 may be similar to that of the heat conducting section 17. The planar shape of the wavelength conversion section 14 may be different from that of the heat conducting section 17.

The shape of a section (photoreception spot) in which light from the semiconductor light emitting device 11 of the wavelength conversion section 14 is received may be circular or elliptical. The area of the photoreception spot may be smaller than the area of the front surface of the wavelength conversion section 14.

In the structure shown in FIG. 1, the front surface of the wavelength conversion section 14 has the same size as the rear surface, and the side surface is orthogonal to the front surface and the rear surface. However, the side surface of the wavelength conversion section 14 may be tapered. In a wavelength conversion member 10B shown in FIG. 2, a recessed portion provided in the heat conducting section 17 is tapered and its opening width becomes smaller toward the bottom. Accordingly, the maximum width d1 of the front surface of the wavelength conversion section 14 embedded in the recessed portion is larger than the maximum width d2 of the rear surface and the wavelength conversion section 14 is tapered and has a slanted side surface. Since the recessed portion in which the wavelength conversion section 14 is embedded is tapered, it is possible to direct, to the front, the light that is generated in the wavelength conversion section 14 and directed to the rear or side, by reflecting the light more efficiently.

If the value (d2/d1) obtained by dividing the maximum width d2 of the rear surface by the maximum width d1 of the front surface of the wavelength conversion section 14 is assumed to be a taper ratio, a taper ratio is desirably small. Specifically, the taper ratio can be 1 or less, may be 0.8 or less, may be 0.6 or less, or may be 0.4 or less. The lower limit of a taper ratio depends on the size of a photoreception spot and the practical size of the wavelength conversion member 10B. For example, the lower limit may be 0.05 or more, 0.1 or more, or 0.2 or more. The maximum width d2 of the rear surface of the wavelength conversion section 14 only needs to be at least the width of a photoreception spot.

Figure 3:
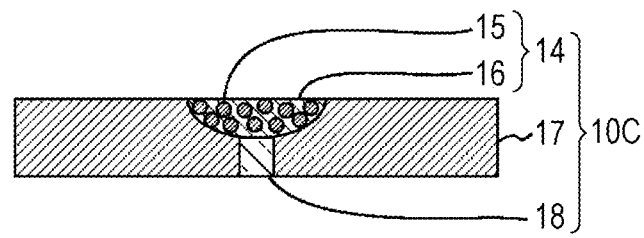
FIG. 3 is a schematic view showing a modification of the wavelength conversion member according to the first embodiment.

As shown in a wavelength conversion member 10C in FIG. 3, the opening width of the recessed portion provided in the heat conducting section 17 may change like a curve or parabola. If the recessed portion is parabolic, the wavelength conversion section 14 embedded in the recessed portion also becomes parabolic. By making the wavelength conversion section 14 parabolic, the light distribution properties of emitting light can be controlled more properly. The parabolic shape used here includes not only a complete paraboloid, but also curved surfaces other than a paraboloid, such as a spherical surface. In addition, a shape having a flat bottom and a curved side surface is also included.

Figure 2:
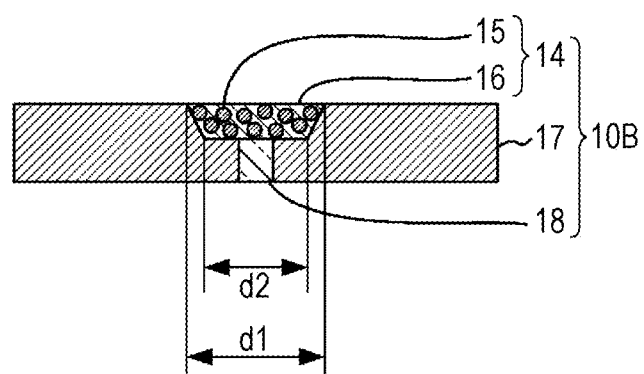
FIG. 2 is a schematic view showing a modification of a wavelength conversion member according to the first embodiment.

FIGS. 1 and 2 show the structure in which the wavelength conversion section 14 is embedded in the recessed portion provided in the heat conducting section 17. However, only a part of the wavelength conversion section 14 may be embedded in the recessed portion provided in the heat conducting section 17 and the other part may project from the front surface of the heat conducting section 17. When the wavelength conversion section 14 is embedded in the recessed portion provided in the heat conducting section 17, the bottom and side surface of the wavelength conversion section 14 make contact with the heat conducting section 17.

Accordingly, as compared with the case in which the wavelength conversion section 14 is provided only on the front surface of the heat conducting section 17, the contact area between the wavelength conversion section 14 and the heat conducting section 17 becomes larger. Accordingly, there is an advantage of enabling radiation with better efficiency.

Figure 4:
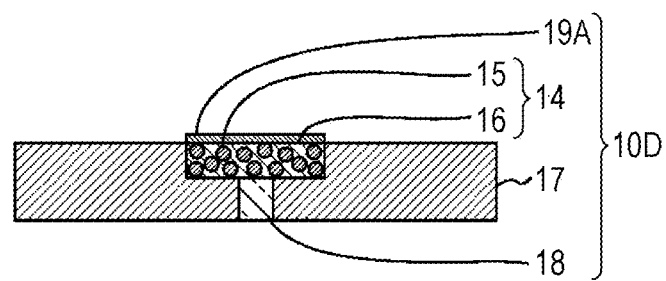
FIG. 4 is a schematic view showing a modification of the wavelength conversion member according to the first embodiment.

As shown in a wavelength conversion member 10D in FIG. 4, a dichroic mirror 19A that transmits the second light whose wavelength has been converted and reflects the first light from the semiconductor light emitting device may be provided on the front surface of the wavelength conversion section 14. This can prevent light from the semiconductor light emitting device whose wavelength has not been converted from being emitted. A reflective film or the like other than a dichroic mirror may be used as long as it transmits the second light whose wavelength has been converted and does not transmit the first light from the semiconductor light emitting device.

Figure 5:
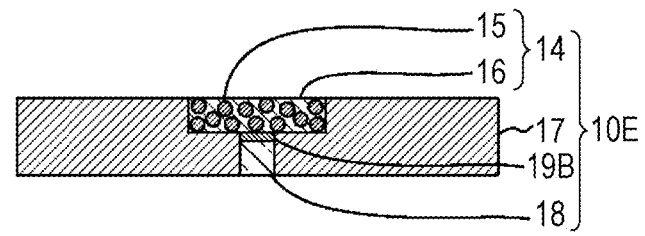
FIG. 5 is a schematic view showing a modification of the wavelength conversion member according to the first embodiment.

As shown in a wavelength conversion member 10E in FIG. 5, a dichroic mirror 19B that transmits the first light from the semiconductor light emitting device 11 and reflects the second light whose wavelength has been converted by the wavelength conversion section 14 may be provided in a region including a photoreception spot on the rear surface side of the wavelength conversion section 14. The dichroic mirror 19B may be provided in contact with the wavelength conversion member 10E and the light guide path 18. This can prevent light emitted from the semiconductor light emitting device 11 from being returned to the semiconductor light emitting device 11 after being reflected. Since the light guide path 18 also reflects the second light whose wavelength has been converted, the emission efficiency of light is further improved. In addition, the dichroic mirror 19B may also be provided on the incident port side of the light guide path 18. It is also possible to provide the dichroic mirror 19B on the rear surface side of the wavelength conversion section 14 or on the incident port side of the light guide path 18 and to provide the dichroic mirror 19A on the front side of the wavelength conversion section 14. The dichroic mirror 19B may be a reflective film that prevents the first light from the semiconductor light emitting device 11 from being reflected.

The wavelength conversion member 10A may be disc-shaped so as to be rotated. This can change the irradiation position on the wavelength conversion member and distribute the portion heated by irradiation. This also applies to the wavelength conversion member 10B.

A heat pipe may be used as a rotational shaft for rotating a disc-shaped wavelength conversion member. This can further promote the radiation of the wavelength conversion member. A cooling fan may also be provided for the rotational shaft to blow air on the wavelength conversion member side. This can further promote the radiation of the wavelength conversion member.

A fan may also be provided for the wavelength conversion member so as to rotate the wavelength conversion member upon receiving air flow caused by irradiation heat. A latch member that allows the wavelength conversion member to rotate in one direction and prevents it from rotating in the opposite direction may be provided so that the wavelength conversion member rotates only in one direction by vibrations. This can rotate the wavelength conversion member without providing a driving motor.

A phosphor with short afterglow may be used as the phosphor of the wavelength conversion section 14. A phosphor with short afterglow is phosphor for which, for example, the time (that is, the afterglow time) until the intensity of the phosphor is reduced to $1/10$ is at most 3 ms. Alternatively, the afterglow time of phosphor multiplied by the motion speed (the angular speed multiplied by the distance from the rotation center to the irradiation position) of the irradiation position may be adjusted to at least 1.1 mm and at most 7.5 mm when the wavelength conversion section is rotated. This can bring the light emission source closer to the point light source. Accordingly, the emission optical system can be small-sized. In addition, light distribution control can be facilitated.

Figure 6:
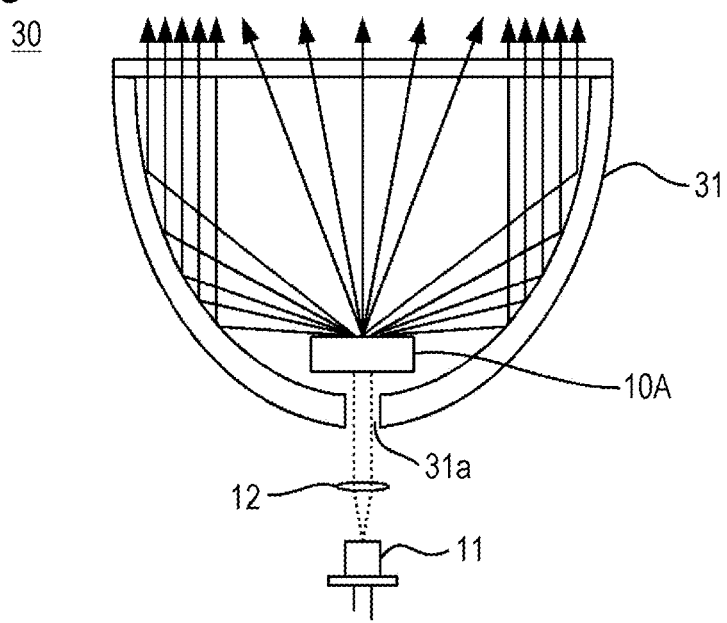
FIG. 6 is a schematic view showing a lamp according to the first embodiment.

The light source according to the present embodiment can be used for a lamp 30 shown in FIG. 6. The lamp 30 may be, for example, a vehicle head lamp, may be special illumination, or may be a lamp for a head-up display or projector.

The lamp 30 has a mirror 31 provided between the semiconductor light emitting device 11 and the wavelength conversion member 10A. The mirror 31 reflects light directed from the wavelength conversion member 10A to a direction different from the light emission direction so that it directs to the light emission direction. The mirror 31 may be, for example, a concave mirror. The mirror 31 has a light transmitting section 31a through which light directed from the semiconductor light emitting device 11 to the wavelength conversion member 10A is transmitted. A metal film made of aluminum (Al), silver (Ag), or the like or a reflective film on which a protective film is formed is provided on a portion of the mirror 31 excluding the light transmitting section 31a. Light emitted from the semiconductor light emitting device 11 is incident on the wavelength conversion section of the wavelength conversion member 10A through the incident optical system 12 and the light transmitting section 31a of the mirror 31. This incident light excites the phosphor of the wavelength conversion section and yellow light and blue light are emitted. The yellow light and the blue light are mixed to generate white light. A part of the white light generated by the wavelength conversion member 10A is directed to the front (side opposite to the mirror 31) directly and the remaining part is reflected by the mirror 31 and then directed to the front.

Although the wavelength conversion member 10A is used in FIG. 6, the wavelength conversion member 10B may be used. Alternatively, the wavelength conversion member 10A or 10B may be disc-shaped so as to be rotated.

The lamp 30 may be of so-called reflector type or projector type. A wavelength cut filter may be provided in any portion of the emitting optical system including the mirror 31 to prevent blue-violet light from the semiconductor light emitting device 11 from emitting externally by absorbing or reflecting the blue-violet light.

The lamp according to the present embodiment can promote the radiation of phosphor and improve at least one of the emission efficiency and reliability even in the case of use in a severe situation such as, for example, driving at a temperature of −40° C. or driving under the blazing sun.

Figure 7:
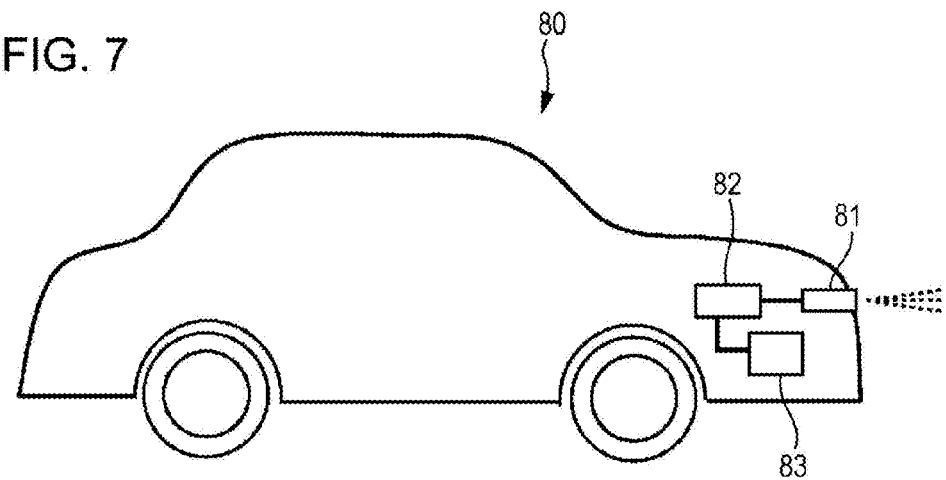
FIG. 7 is a schematic view showing a vehicle according to the first embodiment.

The lamp according to the present embodiment can be used for a vehicle 80, as shown in FIG. 7. The vehicle 80 includes a lamp 81 and an electric power supply source 82. The vehicle 80 may include an electric generator 83 rotated and driven by a driving source such as, for example, an engine. The electric power generated by the electric generator 83 is stored in the electric power supply source 82. The electric power supply source 82 can be a secondary battery. The lamp 81 can be a lamp including, for example, the semiconductor light emitting device 11, the wavelength conversion member 10A, and the mirror 31. Another lamp shown in the present embodiment may be used. For example, a lamp having a wavelength conversion member 10B in place of the wavelength conversion member 10A may be used. A lamp having the wavelength conversion member 10A or 10B that is disc-shaped and rotatable may be used. The vehicle 80 is, for example, an automobile, two-wheel vehicle, or special vehicle. The vehicle 80 may also be an engine vehicle, electric vehicle, or hybrid vehicle.

Second Embodiment

Figure 15:
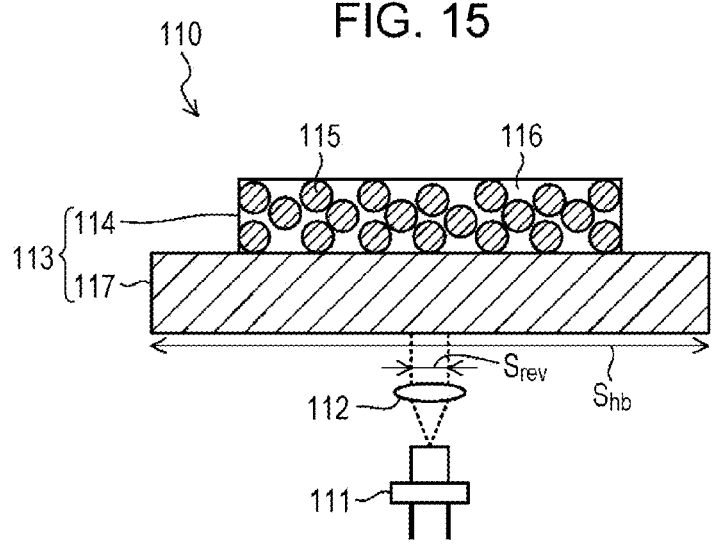
FIG. 15 is a diagram schematically showing the structure of a light source according to a second embodiment.

FIG. 15 is a diagram schematically showing the structure of a light source 110 according to a second embodiment of the present disclosure. The light source 110 includes a wavelength conversion member 113 and a semiconductor light emitting device 111. The semiconductor light emitting device 111 is, for example, a light emitting diode (LED), a super luminescent diode (SLD), a laser diode (LD), or the like. The present embodiment assumes that the semiconductor light emitting device 111 is an LD. The semiconductor light emitting device 111 may be one LD or an optical combination of a plurality of LDs. The semiconductor light emitting device 111 emits, for example, blue light. The semiconductor light emitting device 111 may emit blue-violet light. Alternatively, the semiconductor light emitting device 111 may emit other light or a plurality of types of light.

An incident optical system 112 that guides light from the semiconductor light emitting device 111 to the wavelength conversion member 113 may be provided between the wavelength conversion member 113 and the semiconductor light emitting device 111. The incident optical system 112 includes, for example, a lens, a mirror, and/or an optical fiber.

Figure 16:
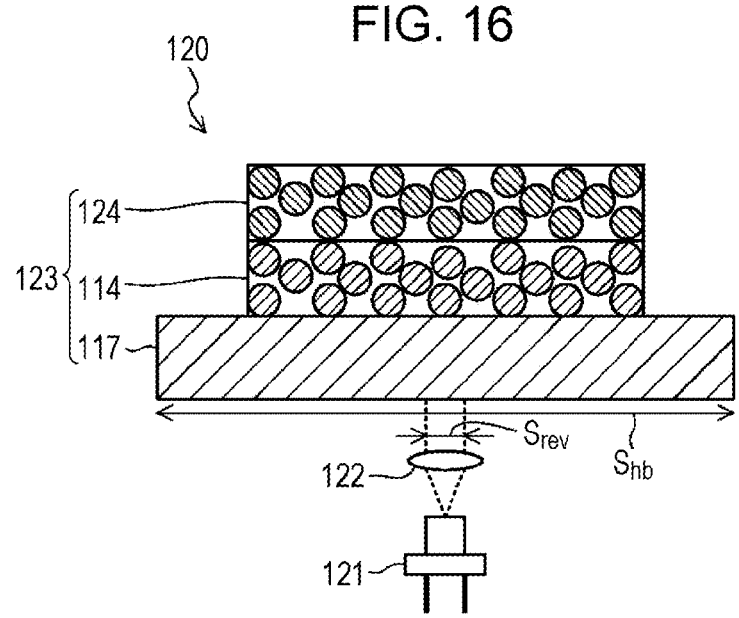
FIG. 16 is a diagram schematically showing the structure of a light source according to a third embodiment.

The wavelength conversion member 113 includes a wavelength conversion layer 114 and a heat conducting layer 117. The wavelength conversion layer may include a plurality of types of layers as shown in FIG. 16. This will be further described in a third embodiment. As shown in the example in FIG. 17, a sapphire single crystal substrate that is transparent in a visible light region may be included between the wavelength conversion layer 114 and the heat conducting layer 117. This will be further described in the fourth embodiment. As shown in the example in FIG. 18, the sapphire single crystal substrate may be larger in size than the wavelength conversion layer 114. This will be further described in the fifth embodiment.

The wavelength conversion layer 114 converts light from the semiconductor light emitting device 111 into light with a longer wavelength. The wavelength conversion layer 114 is, for example, a phosphor layer. The wavelength conversion layer 114 may include phosphor powder 115 and a binder 116. The phosphor powder 115 includes many phosphor particles. The binder 116 is disposed between particles of the phosphor powder 115 to bond the phosphor powder 115. The binder 116 is, for example, an inorganic material.

The binder 116 may be a medium such as resin, glass, or a transparent crystal. The wavelength conversion layer 114 may be phosphor sintered compact (that is, phosphor ceramic) with no binder 116. When the wavelength conversion layer 114 has no binder, breakage due to abrupt temperature changes can be reduced.

When the semiconductor light emitting device 111 emits blue light, the wavelength conversion layer 114 includes, for example, a yellow phosphor. When the semiconductor light emitting device 111 emits blue-violet light, the wavelength conversion layer 114 includes, for example, a yellow phosphor and blue phosphor.

The heat conducting layer 117 is provided so as to be, for example, superimposed on the wavelength conversion layer 114. The heat conducting layer 117 may make contact with the wavelength conversion layer 114. Another layer may be provided between the heat conducting layer 117 and the wavelength conversion layer 114. In addition, the heat conducting layer 117 may be provided on a side of the front surface of the wavelength conversion layer 114 or may be provided on a side of the back surface of the wavelength conversion layer 114. The area of the front surface or the area of the back surface of the heat conducting layer 117 is, for example, at least 2800 times as large as the photoreception area of the wavelength conversion layer 114. The area of the front surface or the area of the back surface of the heat conducting layer 117 is at least 8000 times as large as the photoreception area of the wavelength conversion layer 114. This suppresses rises in the temperature of the wavelength conversion layer 114, thereby improving the emission efficiency or reliability.

The front surface is the surface on which light from the semiconductor light emitting device 111 is incident and the back surface is the surface opposite to the front surface. The photoreception area of the wavelength conversion layer 114 is the area used to receive light from the semiconductor light emitting device 111 among the front surface of the semiconductor light emitting device 111. For example, the photoreception spot is circular or elliptical. The photoreception area in FIG. 15 is indicated by $S_{rev}$. For example, the heat conducting layer 117 is disc-shaped. The front surface or the back surface of the heat conducting layer 117 in FIG. 15 is a circle with a diameter of L and the area is represented by $S_{hb} = \pi \cdot (L/2)^2$.

The heat conducting layer 117 is, for example, a heat bath. The heat conducting layer 117 may have a thermal conductivity of 30 W/(m·K) or more. The heat conducting layer 117 may also have a thermal conductivity of 42 W/(m·K) or more. The heat conducting layer 117 may also have a thermal conductivity of 230 W/(m·K) or more. This further suppresses rises in the temperature of the wavelength conversion layer 114, thereby improving the emission efficiency and/or reliability. The heat conducting layer 117 includes, for example, an inorganic material. The heat conducting layer 117 may include, Al, resin, glass, a transparent crystal, or the like. The heat conducting layer 117 may be transparent in a visible region.

Next, the behavior of the light source 110 according to the present embodiment will be described. Light emitted from the semiconductor light emitting device 111 is incident on the wavelength conversion layer 114 through the incident optical system 112 and the heat conducting layer 117. This incident light excites the phosphor of the wavelength conversion layer 114 and yellow light and blue light are emitted. The yellow light and the blue light are mixed to generate white light.

During emission of light, the phosphor generates heat. The heat from the phosphor is conducted from the wavelength conversion layer 114 to the heat conducting layer 117. If the front surface or back surface of the heat conducting layer 117 is at least 2800 times as large as the photoreception area of the wavelength conversion layer 114, the radiation of the phosphor is significantly promoted. If the front surface or back surface of the heat conducting layer 117 is at least 8000 times as large as the photoreception area of the wavelength conversion layer 114, the radiation of the phosphor is further promoted. This will be further described in examples 1 to 3.

As described above, according to the second embodiment of the present disclosure, if the front surface or back surface of the heat conducting layer 117 is at least 2800 times as large as the photoreception area of the wavelength conversion layer 114, the radiation of the phosphor is significantly promoted, thereby improving the emission efficiency or reliability.

Third Embodiment

FIG. 16 is a diagram schematically showing the structure of a light source 120 according to a third embodiment of the present disclosure. The same components as in the second embodiment are given the same reference characters and differences will be mainly described below.

The light source 120 includes a wavelength conversion member 123 and a semiconductor light emitting device 121. An incident optical system 122 that guides light from the semiconductor light emitting device 121 to the wavelength conversion member 123 may be provided between the wavelength conversion member 123 and the semiconductor light emitting device 121. The incident optical system 122 includes, for example, a lens, mirror, and/or optical fiber.

The semiconductor light emitting device 121 is, for example, a light emitting diode (LED), a super luminescent diode (SLD), a laser diode (LD), or the like. The present embodiment assumes that the semiconductor light emitting device 121 is an LD. The semiconductor light emitting device 121 may be one LD or an optical combination of a plurality of LDs. The semiconductor light emitting device 121 emits, for example, blue-violet light.

Figure 17:
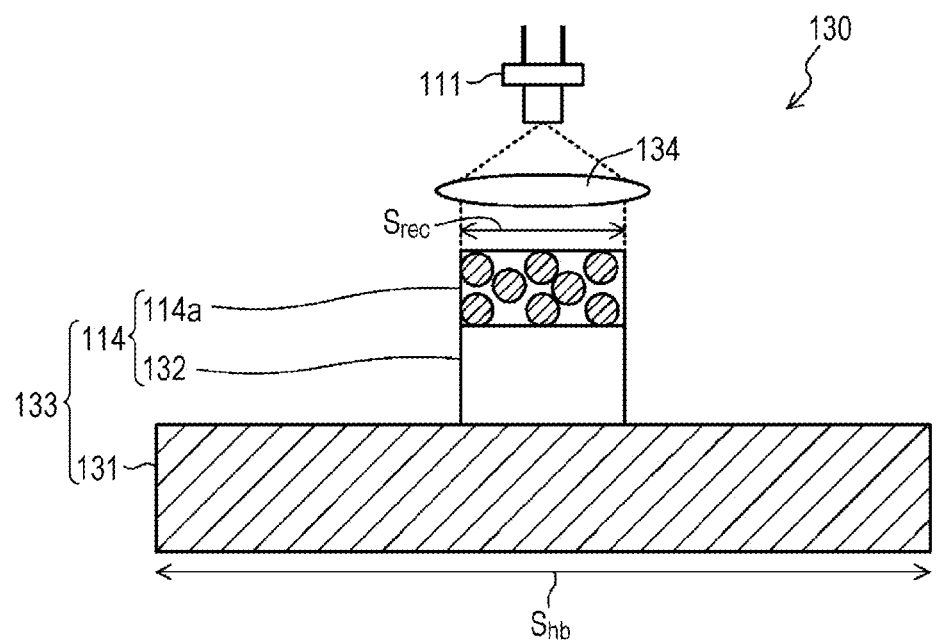
FIG. 17 is a diagram schematically showing the structure of a light source according to a fourth embodiment.
Figure 18:
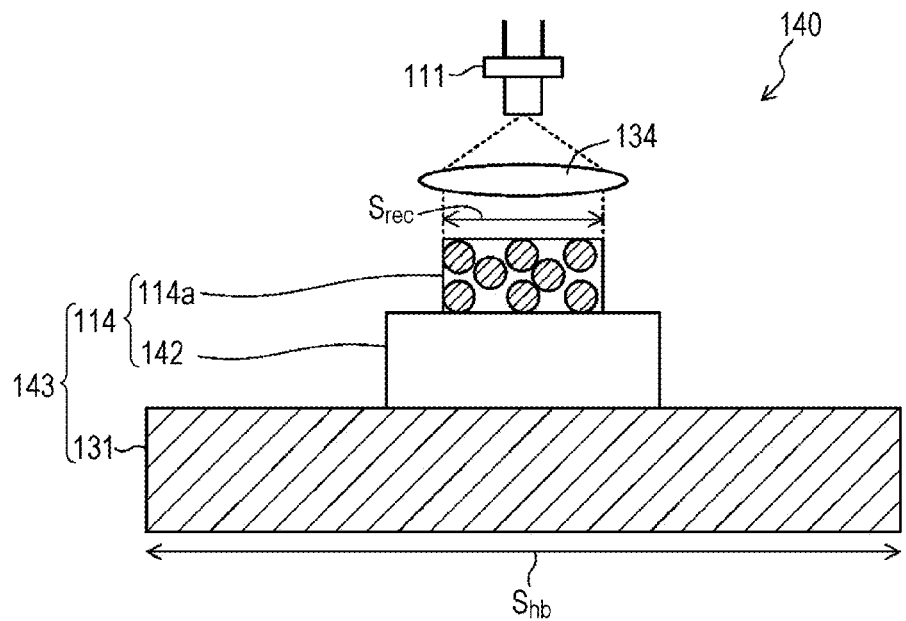
FIG. 18 is a diagram schematically showing the structure of a light source according to a fifth embodiment.

The wavelength conversion member 123 includes the two wavelength conversion layers 114 and 124 and the heat conducting layer 117. A sapphire substrate may be provided between the wavelength conversion layer 114 and the heat conducting layer 117 as shown in FIGS. 17 and 18. This will be further described in fourth and fifth embodiments. A wavelength conversion layer 124 converts light from semiconductor light emitting device 121 into light with a longer wavelength.

The wavelength conversion layer 124 is, for example, a phosphor layer. The wavelength conversion layer 124 may include phosphor powder and a binder. The phosphor powder includes many phosphor particles. The binder is disposed in the phosphor powder to bond the phosphor powder. The binder is, for example, an inorganic material. The binder may be a medium such as resin, glass, or a transparent crystal. The wavelength conversion layer 124 may be phosphor sintered compact (that is, phosphor ceramic) with no binder. When the wavelength conversion layer 124 has no binder, breakage due to abrupt temperature changes can be reduced. At least one of a plurality of types of phosphor layers does not need to include a binder.

For example, when the semiconductor light emitting device 121 emits blue-violet light, the wavelength conversion layer 114 includes a yellow phosphor and the wavelength conversion layer 124 includes a blue phosphor. The wavelength conversion layers 124 and 114 and the heat conducting layer 117 are provided so as to be superimposed together, for example. The heat conducting layer 117 may make contact with the wavelength conversion layer 114 and another layer may be provided between the heat conducting layer 117 and the wavelength conversion layer 114. The heat conducting layer 117 may be provided on a side of the front surface of the wavelength conversion layer 114 or may be provided on a side of the back surface of the wavelength conversion layer 124. Either the front surface or the back surface of the heat conducting layer 117 is 2800 or 8000 times as large as, for example, the photoreception area of the wavelength conversion layer 114. This suppresses rises in the temperature of the wavelength conversion layers 114 and 124, thereby improving the emission efficiency or reliability.

Next, the behavior of the light source 120 according to the present embodiment will be described. Light emitted from the semiconductor light emitting device 121 passes through the incident optical system 122 and the heat conducting layer 117 and is incident on the wavelength conversion layer 114. This incident light excites the phosphor of the wavelength conversion layer 114 and yellow light is emitted. A part of light from the semiconductor light emitting device 121 is incident on the wavelength conversion layer 124 through the wavelength conversion layer 114. This incident light excites the phosphor of the wavelength conversion layer 124 and blue light is emitted. The yellow light and the blue light are mixed to generate white light.

The third embodiment of the present disclosure can also obtain effects similar to those in the second embodiment.

Fourth Embodiment

FIG. 17 is a diagram schematically showing the structure of a light source 130 according to a fourth embodiment of the present disclosure. The same components as in the second embodiment are given the same reference characters and differences will be mainly described below.

The light source 130 includes a wavelength conversion member 133 and the semiconductor light emitting device 111. The wavelength conversion member 133 includes the wavelength conversion layer 114 and a heat conducting layer 131. The wavelength conversion layer 114 may include a plurality of layers. For example, the wavelength conversion layer 114 includes a phosphor layer 114a and a sapphire single crystal substrate 132 disposed between the phosphor layer 114a and the heat conducting layer 131. Instead of this structure, the phosphor layer 114a may be disposed between the sapphire single crystal substrate 132 and the heat conducting layer 131.

The sapphire single crystal substrate 132 is transparent in a visible light region. The front surface or back surface of the sapphire single crystal substrate 132 has the same size as the front surface or back surface of the phosphor layer 114a. The area of the contact surface between the sapphire single crystal substrate 132 and the phosphor layer 114a facing the sapphire single crystal substrate 132 and the area of the contact surface between the sapphire single crystal substrate 132 and the heat conducting layer 131 facing the sapphire single crystal substrate 132 may be the same as the photoreception area used by the wavelength conversion layer 114 to receive light from the semiconductor light emitting device 111 or may be at least 3.1 times as large as the photoreception area. This will be further described in example 6.

In addition, the area of the front surface or back surface of the sapphire single crystal substrate 132 may be at least twice as large as the photoreception area.

The heat conducting layer 131 is provided so as to be, for example, superimposed on the wavelength conversion layer 114 and the sapphire single crystal substrate 132. The area of the front surface or the area of the back surface of the heat conducting layer 131 is, for example, at least 2800 times as large as the photoreception area of the wavelength conversion layer 114 and, more desirably, at least 8000 times. This suppresses rises in the temperature of the wavelength conversion layer 114, thereby improving the emission efficiency or reliability. The photoreception area in FIG. 17 is indicated by $S_{rec}$. For example, the heat conducting layer 131 is disc-shaped. The front surface or the back surface of the heat conducting layer 131 in FIG. 17 is a circle with a diameter of L and the area is represented by $S_{hb}=\pi \cdot (L/2)^2$.

The heat conducting layer 131 is, for example, a heat bath. The heat conducting layer 131 may have a thermal conductivity of 30 W/(m·K) or more, 42 W/(m·K) or more, or 230 W/(m·K) or more. This further suppresses reses in the temperature of the wavelength conversion layer 114, thereby improving the emission efficiency and/or reliability. The heat conducting layer 131 may be made of metal or may be made of Al. The heat conducting layer 131 is, for example, a reflecting body with respect to visible light and has a thermal conductivity of 237.5 W/(m·K) or more. The heat conducting layer 131 may reflect light having the light emission wavelength of the semiconductor light emitting device 111 and the wavelength conversion layer 114.

An incident optical system 134 that guides light from the semiconductor light emitting device 111 to the wavelength conversion member 113 may be provided between the wavelength conversion member 113 and the semiconductor light emitting device 111. The incident optical system 134 includes, for example, a lens, a mirror, and/or an optical fiber.

Next, the behavior of the light source 130 according to the present embodiment will be described. Light emitted from the semiconductor light emitting device 111 is incident on the phosphor layer 114a of the wavelength conversion layer 114 through the incident optical system 134. This incident light excites the phosphor of the wavelength conversion layer 114a and yellow light and blue light are emitted. The yellow light and the blue light are mixed to generate white light. The yellow light and the blue light pass through the sapphire single crystal substrate 132 or directly reach the heat conducting layer 131 and are reflected by the heat conducting layer 131. A part of light from the semiconductor light emitting device 111 passes through the wavelength conversion layer 114 and/or the sapphire single crystal substrate 132, reaches the heat conducting layer 131, and is reflected by the heat conducting layer 131.

Heat generates during light emission of the phosphor. The heat from the phosphor is conducted from the phosphor layer 114a to the heat conducting layer 131 through the sapphire single crystal substrate 132. When either the front surface or the back surface of the heat conducting layer 131 is at least 2800 times or at least 8000 times as large as the photoreception area of the wavelength conversion layer 114, the radiation of the phosphor is promoted.

According to the fourth embodiment of the present disclosure, the same effects as in the second and third embodiments can be obtained and the radiation of the phosphor is further promoted by use of the heat conducting layer 131 with a large thermal conductivity, thereby improving the emission efficiency or reliability.

Fifth Embodiment

FIG. 18 is a diagram schematically showing the structure of a light source 140 according to a fifth embodiment of the present disclosure. The same components as in the fourth embodiment are given the same reference characters and differences will be mainly described below.

The light source 140 includes a wavelength conversion member 143 and the semiconductor light emitting device 111. The wavelength conversion member 143 includes the wavelength conversion layer 114 and the heat conducting layer 131. The wavelength conversion layer 114 may include a plurality of layers. For example, the wavelength conversion layer 114 includes the phosphor layer 114a and a sapphire single crystal substrate 142 disposed between the phosphor layer 114a and the heat conducting layer 131. Instead of this structure, the phosphor layer 114a may be disposed between the sapphire single crystal substrate 142 and the heat conducting layer 131.

The sapphire single crystal substrate 142 is transparent in a visible light region. The front surface or back surface of the sapphire single crystal substrate 142 is larger than the front surface or back surface of the phosphor layer 114a. The area of the contact surface between the sapphire single crystal substrate 142 and the wavelength conversion layer 114 facing the sapphire single crystal substrate 142 or the area of the contact surface between the sapphire single crystal substrate 142 and the heat conducting layer 131 facing the sapphire single crystal substrate 142 may be the same as the photoreception area used by the wavelength conversion layer 114 to receive light from the semiconductor light emitting device 111 or may be at least 3.1 times as large as the photoreception area.

In addition, the area of the front surface of the sapphire single crystal substrate 142 may be at least twice as large as the photoreception area.

Next, the behavior of the light source 140 according to the present embodiment will be described. Light emitted from the semiconductor light emitting device 111 is incident on the wavelength conversion layer 114 through the incident optical system 134. This incident light excites the phosphor of the wavelength conversion layer 114a of the wavelength conversion layer 114 and yellow light and blue light are emitted. The yellow light and the blue light are mixed to generate white light. The yellow light and the blue light pass through the sapphire single crystal substrate 142 or directly reach the heat conducting layer 131 and are reflected by the heat conducting layer 131. A part of light from the semiconductor light emitting device 111 passes through the wavelength conversion layer 114 and/or the sapphire single crystal substrate 142, reaches the heat conducting layer 131, and is reflected by the heat conducting layer 131.

Heat generates during emission of the phosphor. The heat from the phosphor is conducted from the phosphor layer 114a to the side of the heat conducting layer 131 through the sapphire single crystal substrate 142. When either the front surface or the back surface of the heat conducting layer 131 becomes 2800 times or more desirably at least 8000 times as large as the photoreception area of the wavelength conversion layer 114a, the radiation of the phosphor is promoted.

According to the fifth embodiment of the present disclosure, the same effects as in the fourth embodiment can be obtained and, by making the front surface or back surface of the sapphire single crystal substrate 142 larger than the wavelength conversion layer 114, the radiation of the phosphor is further promoted, thereby improving the emission efficiency or reliability.

Sixth Embodiment

Figure 19:
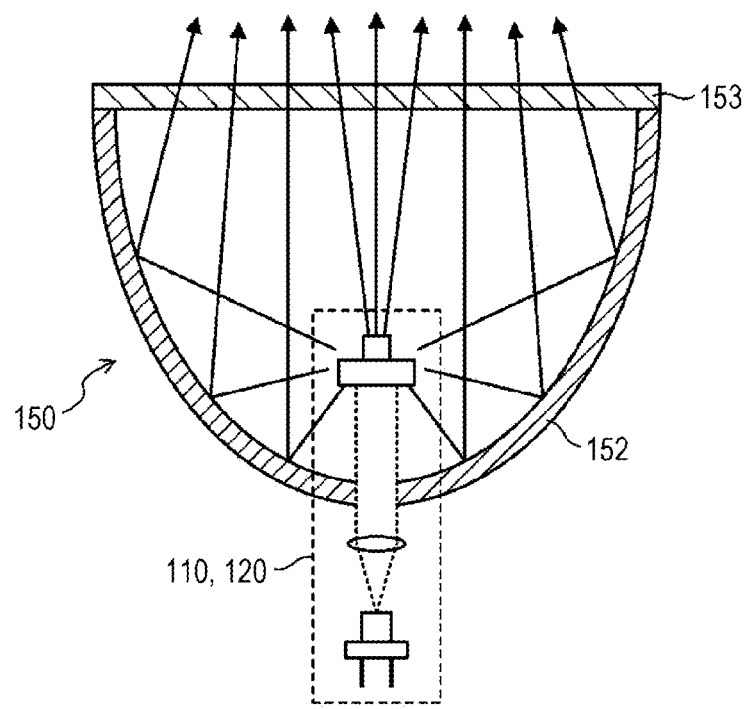
FIG. 19 is a diagram schematically showing the structure of a vehicle head lamp according to a sixth embodiment.

FIG. 19 is a cross-sectional view schematically showing the structure of a vehicle head lamp 150 according to a sixth embodiment of the present disclosure. The same components as in the second or third embodiment are given the same reference numerals.

The vehicle head lamp 150 includes the light source 110 or 120 according to the second or third embodiment and a reflecting mirror 152 of, for example, concave shape. The reflecting mirror 152 guides light from the light source 110 or 120 to a specific direction, for example, to the front when the vehicle head lamp 150 is installed in the vehicle. The reflecting mirror 152 is disposed between, for example, the semiconductor light emitting device 111 or 121 and the wavelength conversion member 113 or 123 and has a transmitting section through which light directed from the semiconductor light emitting device 111 or 121 to the wavelength conversion member 113 or 123 is transmitted. The reflecting mirror 152 has, for example, a metal film made of Al, Ag, or the like or an Al film on which a protective film is formed.

The vehicle head lamp 150 may be of so-called projector type or reflector type. A wavelength cut filter may be provided in any portion of the emitting optical system including the reflecting mirror 152 to prevent blue-violet light from the semiconductor light emitting device 111 or 132 from emitting externally by absorbing or reflecting the blue-violet light. For example, as shown in FIG. 19, a wavelength cut filter 153 may be provided so as to cover the reflecting mirror 152 with a concave surface.

Next, the behavior of the vehicle head lamp 150 will be described. Light emitted from the semiconductor light emitting device 111 or 121 is incident on the wavelength conversion layer 114 and/or the wavelength conversion layer 124 of the wavelength conversion member 113 or 123 through the incident optical system 112 or 122. For example, when the semiconductor light emitting device 111 or 121 emits blue-violet light and the wavelength conversion layer 114 and/or the wavelength conversion layer 124 have a yellow phosphor and a blue phosphor, these phosphors are excited to emit yellow light and/or blue light. The yellow light and blue light are mixed to generate white light. The yellow light and blue light are directed to the front directly or reflected by the reflecting mirror 152 and then directed to the front.

According to the sixth embodiment, it is possible to promote the radiation of phosphor and improve the emission efficiency and/or reliability even for a head light used in a severe situation such as, for example, driving at a temperature of −40° C. or driving under the blazing sun.

Seventh Embodiment

Figure 20:
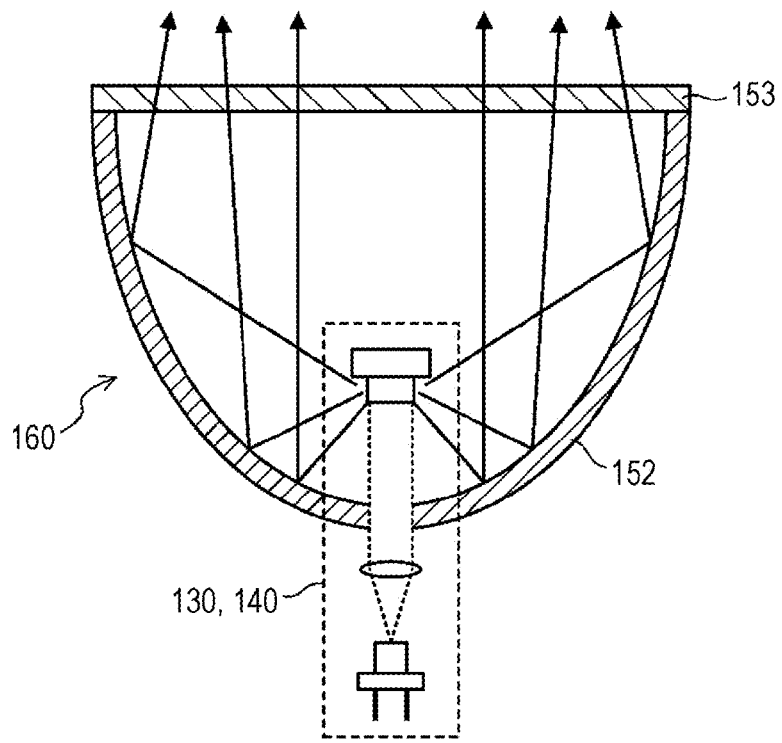
FIG. 20 is a diagram schematically showing the structure of a vehicle head lamp according to a seventh embodiment.

FIG. 20 is a cross-sectional view schematically showing the structure of a vehicle head lamp 160 according to a seventh embodiment of the present disclosure. The same components as in the fourth, fifth, or sixth embodiment are given the same reference numerals.

The vehicle head lamp 160 includes the light source 130 or 140 according to the fourth or fifth embodiment and the reflecting mirror 152. The reflecting mirror 152 guides light from the light source 130 or 140 to the front. The reflecting mirror 152 is disposed, for example, between the semiconductor light emitting device 111 and the wavelength conversion member 133 or 143 and has a transmitting section through which light directed from the semiconductor light emitting device 111 to the wavelength conversion member 133 or 143 is transmitted. The vehicle head lamp 160 may be of so-called projector type or reflector type.

Next, the behavior of the vehicle head lamp 160 will be described. Light emitted from the semiconductor light emitting device 111 is incident on the wavelength conversion layer 114 through the incident optical system 134. For example, when the semiconductor light emitting device 111 emits blue-violet light and the phosphor layer 114a of the wavelength conversion layer 114 has a yellow phosphor and blue phosphor, these phosphors are excited to emit yellow light and blue light. The yellow light and blue light are mixed to generate white light. The yellow light and blue light are directed to the reflecting mirror 152 directly or reflected by the heat conducting layer 131 and then directed to the reflecting mirror 152, and then reflected by the reflecting mirror 152 and directed to the front.

The seventh embodiment can obtain effects similar to those in the sixth embodiment.

Eighth Embodiment

Figure 21:
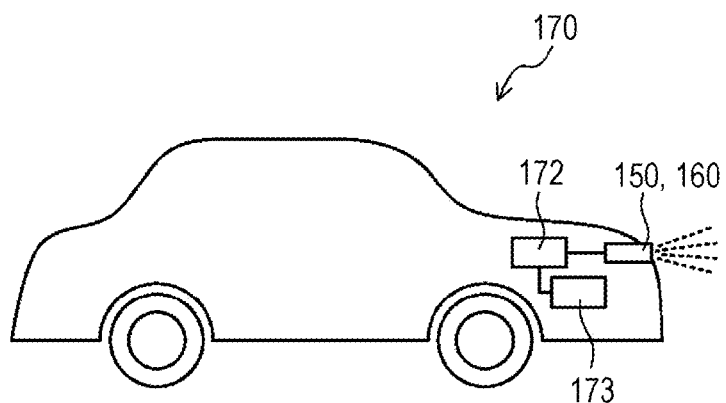
FIG. 21 is a diagram schematically showing the structure of a vehicle according to an eighth embodiment.

FIG. 21 is a diagram schematically showing the structure of a vehicle 170 according to eighth embodiment. The vehicle 170 includes the vehicle head lamp 150 or 160 according to sixth or seventh embodiment and an electric power supply source 172. The vehicle 170 may have an electric generator 173 that is rotated and driven by a driving source such as an engine and generates electric power. The electric power generated by the electric generator 173 is stored in the electric power supply source 172. The electric power supply source 172 is a chargeable-rechargeable secondary battery. The vehicle head lamp 150 or 160 is illuminated by electric power from the electric power supply source 172. The vehicle 170 is, for example, an automobile, two-wheel vehicle, or special vehicle. The vehicle 170 may also be an engine vehicle, electric vehicle, or hybrid vehicle.

The eighth embodiment can obtain the effects in the second to seventh embodiments in the vehicle.

The second to eighth embodiments may be combined as appropriate.

Other Embodiments

The wavelength conversion member may be disc-shaped so as to be rotated about the rotational shaft that is positioned at the center of the disc so as to be orthogonal to the disc. This can change the irradiation position of light from an emitting device such as an LD on the wavelength conversion member and distribute the portion heated by irradiation. The second to fifth embodiments also apply to the case in which a disc-shaped wavelength conversion member is rotated and effects similar to those in the second to fifth embodiments can be obtained.

A phosphor with short afterglow may be used as the phosphor of the wavelength conversion layer. The phosphor with short afterglow is a phosphor for which, for example, the time (that is, the afterglow time) until the intensity of the phosphor is reduced to 1/10 is at most 3 ms. Alternatively, the afterglow time of phosphor multiplied by the motion speed (the angular speed multiplied by the distance from the rotation center to the irradiation position) of the irradiation position may be adjusted to at least 1.1 mm and at most 7.5 mm. This can bring the light emission source closer to the point light source. Accordingly, the emission optical system can be small-sized and light distribution control can be facilitated.

A heat pipe may be used as a rotational shaft for rotating a disc-shaped wavelength conversion member. This can further promote the radiation of the wavelength conversion member. A cooling fan may also be provided for the rotational shaft to blow air on the wavelength conversion member side. This can further promote the radiation of the wavelength conversion member.

A fan may also be provided for the wavelength conversion member so as to rotate the wavelength conversion member upon receiving air flow caused by irradiation heat. A latch member that allows the wavelength conversion member to rotate in one direction and prevents it from rotating in the opposite direction may be provided so that the wavelength conversion member rotates only in one direction by vibrations. This can rotate the wavelength conversion member without providing a driving motor.

The characteristics of the wavelength conversion member according to the present embodiment will be further described using examples.

Example 1

Figure 8:
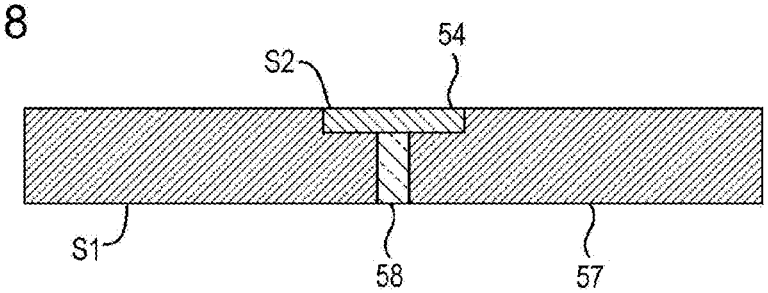
FIG. 8 is a schematic view showing a wavelength conversion member in example 1.

FIG. 8 is a schematic view showing a wavelength conversion member in example 1. The wavelength conversion member according to example 1 includes a heat conducting section 57 that is a heat bath made of Al, a wavelength conversion section 54 that is a phosphor layer embedded in a recessed portion provided in the heat conducting section 57, and a light guide path 58 that extends through the heat conducting section 57 and is optically connected to the wavelength conversion section 54.

The wavelength conversion section 54 uses $Y_3Al_5O_{12}$:Ce (referred to below as YAG) as the phosphor and glass or ZnO as the binder. The wavelength conversion section 54 is a rectangular parallelepiped that is 0.4 mm high, 0.8 mm wide, and 0.1 mm thick and has a volume of 0.032 $mm^3$. The front surface and rear surface of the wavelength conversion section 54 are rectangles that are 0.4 mm high and 0.8 mm wide and have an area of 0.32 $mm^2$. When glass is used as the binder, the wavelength conversion section 54 has a thermal conductivity of 7.75 W/(m·K). When ZnO is used as the binder, the wavelength conversion section 54 has a thermal conductivity of 34 W/(m·K). The wavelength conversion section 54 has a radiation rate of 0.9 and a thermal transfer coefficient of $1\times10^{-5}$ W/($mm^2$·°C.).

The heat conducting section 57 is a rectangular parallelepiped that is 20 mm high, 20 mm wide, and 3 mm thick. The outline shape of the front surface and rear surface of the heat conducting section 57 is a square that is 20 mm high and 20 mm wide. The heat conducting section 57 has a thermal conductivity of 237.5 W/(m·K), a radiation rate of 0.7, and a thermal transfer coefficient of $1\times10^{-5}$ W/($mm^2$·°C.).

The light guide path 58 has a diameter of 0.3 mm and a height of 2.9 mm and is a hollow through hole that does not include a transparent material or a through hole that includes a transparent material.

Figure 9:
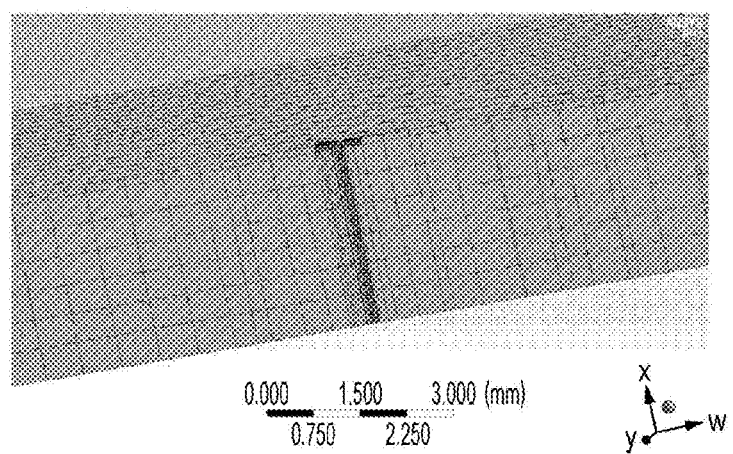
FIG. 9 is a diagram showing an analysis method in example 1.

The thermal characteristics when the wavelength conversion section 54 is irradiated with laser light with an incident power of 5 W through the light guide path 58 were subjected to thermal simulation analysis by changing the material with which the light guide path 58 is filled. In this simulation, the nodes on an interface are all shared with a hexagonal mesh (see FIG. 9).

Figure 10:
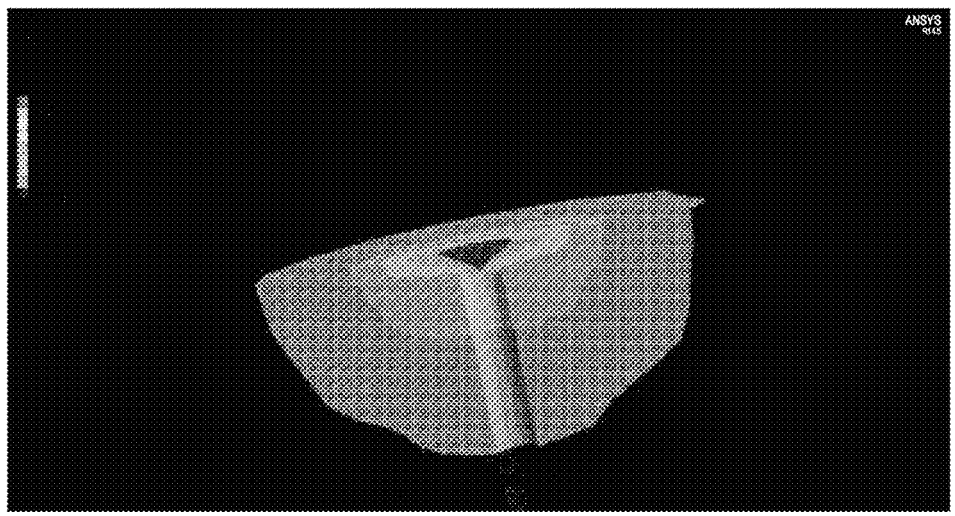
FIG. 10 is a diagram showing an analysis result in example 1.
Figure 10:
Figure 11:
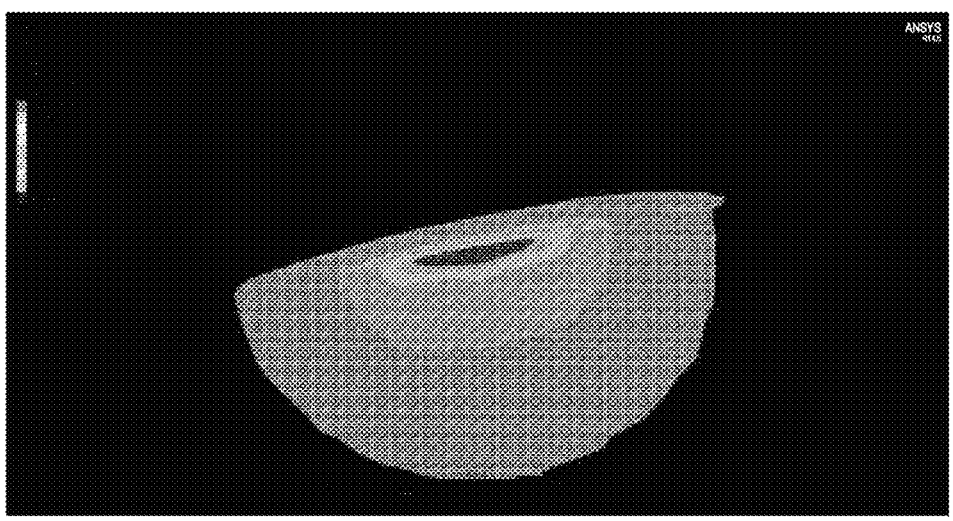
FIG. 11 is a diagram showing an analysis result in example 1.
Figure 11:

FIG. 10 shows the simulation results when the light guide path 58 is hollow. As shown in FIG. 10, heat spreads peripherally from the portion irradiated with a semiconductor light emitting device. However, since the light guide path 18 is hollow, it can be see that transfer of heat is inhibited. FIG. 11 shows the simulation results when the light guide path 58 is filled with ZnO. As shown in FIG. 11, it can be seen that transfer of heat has been improved as compared with the case in which the light guide path 58 is hollow.

The temperature of the wavelength conversion section 54 using glass as the binder was 143° C. when the light guide path 58 was hollow, 137° C. when the light guide path 58 was filled with ZnO, 138° C. when the light guide path 58 was filled with sapphire, and 141° C. when the light guide path 58 was filled with quartz glass. The temperature of the heat conducting section 57 was 105° C. in either case. When glass is used as the binder, the temperature of the wavelength conversion section 54 was reduced by approximately 2° C. to 6° C. by filling the light guide path 58 with a transparent material, as compared with the case in which the light guide path 58 was hollow. When the light guide path 58 was filled with a material with a larger thermal conductivity, the temperature of the wavelength conversion section 54 could be kept lower.

The temperature of the wavelength conversion section 54 when ZnO was used as the binder was 118° C. when the light guide path 58 was hollow, 116° C. when the light guide path 58 was filled with ZnO, 117° C. when the light guide path 58 was filled with sapphire, and 117° C. when the light guide path 58 was filled with quartz glass. The temperature of the heat conducting section 57 was 105° C. in either case. When ZnO with a thermal conductivity larger than that of glass was used as the binder, the temperature of the wavelength conversion section 54 could be reduced by approximately 25° C. as compared with the case in which the binder was glass even when the light guide path 58 was hollow. By filling the light guide path 58 with a transparent material, the temperature of the wavelength conversion section 54 could be further reduced by 1° C. to 2° C. as compared with the case in which the light guide path 58 was hollow.

Table 1 collectively shows simulation results.

| | | Temperature (° C.) | | | |
| | | Glass binder | | ZnO binder | |
| | | Wavelength conversion member | Heat conducting section | Wavelength conversion member | Heat conducting section |
|---|---|---|---|---|---|
| Light guide path | Hollow | 143 | 105 | 118 | 105 |
| | Quartz glass | 141 | 105 | 117 | 105 |
| | Sapphire | 138 | 105 | 117 | 105 |
| | ZnO | 137 | 105 | 116 | 105 |

Example 2

Figure 12:
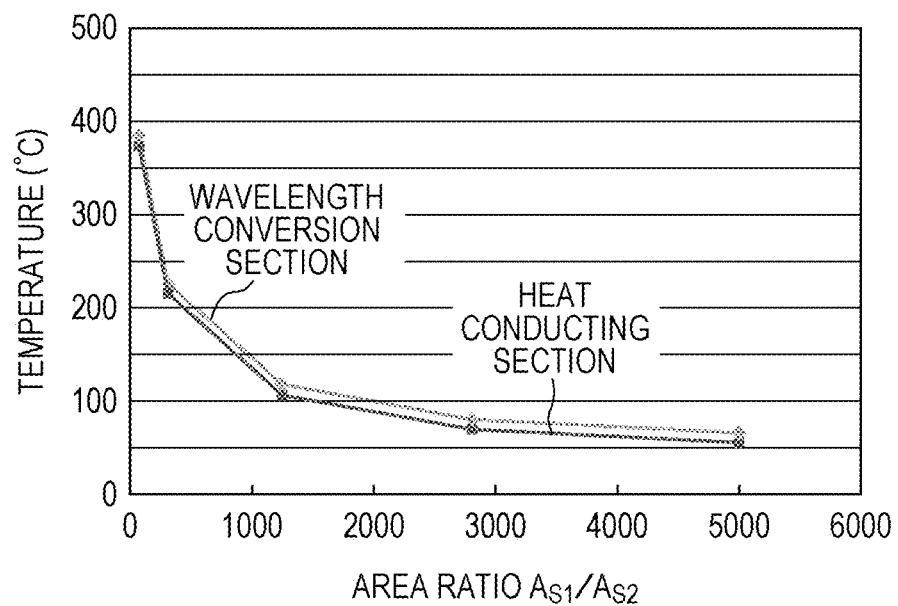
FIG. 12 is a graph showing an analysis result in example 2.

In the wavelength conversion member similar to that in FIG. 8, the temperatures of the wavelength conversion section 54 and the heat conducting section 57 were obtained using simulation by changing the size of the heat conducting section 57 while making the size of the wavelength conversion section 54 constant. FIG. 12 shows simulation results. In FIG. 12, the horizontal axis represents the area ratio $A_{S1}/A_{S2}$ obtained by dividing the area $A_{S1}$ of the rear surface S1 of the heat conducting section 57 by the area $A_{S2}$ of the front surface S2 of the wavelength conversion section 54 and the vertical axis represents the temperature of the wavelength conversion section 54 or the heat conducting section 57. The wavelength conversion section 54 uses ZnO as the binder and is 0.4 mm high, 0.8 mm wide, and 0.1 mm thick. The heat conducting section 57 is made of aluminum and 3 mm thick. The light guide path 58 has a diameter of 0.3 mm and a height of 2.9 mm and is filled with ZnO.

When the area ratio $A_{S1}/A_{S2}$ obtained by dividing the area $A_{S1}$ of the rear surface S1 of the heat conducting section 57 by the area $A_{S2}$ of the front surface S2 of the wavelength conversion section 54 was 78, 313, 1250, 2813, and 5000, the temperature of the wavelength conversion section 54 was 383° C., 224° C., 116° C., 80° C., and 64° C., respectively. The temperature of the heat conducting section 57 was 373° C., 214° C., 105° C., 70° C., and 54° C., respectively. By increasing the area ratio $A_{S1}/A_{S2}$, the temperatures of the wavelength conversion section 54 and the heat conducting section 57 can be kept low. By increasing the area ratio $A_{S1}/A_{S2}$ to 2800 or more, the temperatures of the wavelength conversion section 54 and the heat conducting section 57 can be kept lower. By increasing the area ratio $A_{S1}/A_{S2}$ to 5000 or more, the temperatures of the wavelength conversion section 54 and the heat conducting section 57 can be further kept lower.

Example 3

Figure 13:
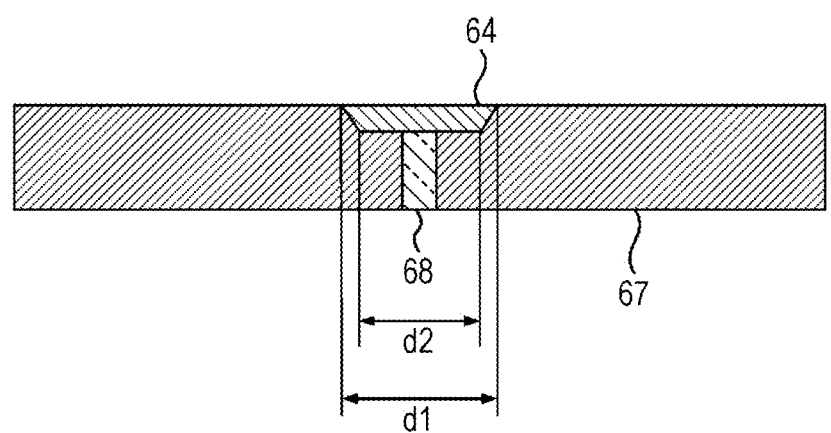
FIG. 13 is a schematic view showing a wavelength conversion member in example 3.

FIG. 13 schematically shows the structure of a wavelength conversion member in example 3. The wavelength conversion member according to example 3 includes a heat conducting section 67 that is a heat bath made of Al, a wavelength conversion section 64 that is embedded in a recessed portion provided in the heat conducting section 67, and a light guide path 68 that extends through the heat conducting section 67 and is optically connected to the wavelength conversion section 64. The heat conducting section 67 is a rectangular parallelepiped that is 20 mm high, 20 mm wide, and 3 mm thick. The outlines of the front surface and rear surface of the heat conducting section 67 are squares that are 20 mm high and 20 mm wide. The wavelength conversion section 64 is tapered and includes the front surface with the maximum width d1 and the rear surface with the maximum width d2 that is smaller than d1. The ratio (d2/d1) of the maximum width d2 of the rear surface of the wavelength conversion section 64 to the maximum width d1 of the front surface is referred to as a taper ratio.

The optical output when the wavelength conversion section 64 is irradiated with laser light from the light guide path 68 was analyzed using optical simulation by changing the taper ratio d2/d1 of the wavelength conversion section 64. The taper ratio d2/d1 was changed by changing the maximum width d2 of the rear surface while making the maximum width d1 of the front surface constant. In the optical simulation, ray tracing software LightTools Ver.8.0.0 created by Optical Research Associates was used. In the simulation, a light source with a wavelength of 445 nm was disposed in the outer end part of the light guide path 68 for calculation and a far-field light receiver was disposed so as to cover the entire wavelength conversion member. Tracing was performed using the Monte Carlo method from when five hundred thousand light beams were emitted until a part of light from the light source was converted into light with a longer wavelength by the wavelength conversion section and entered the light receiver. The integral value of all energy of the spectrum from 420 nm to 800 nm that entered the far-field light receiver was calculated for each taper ratio and relative comparison was made.

Figure 14:
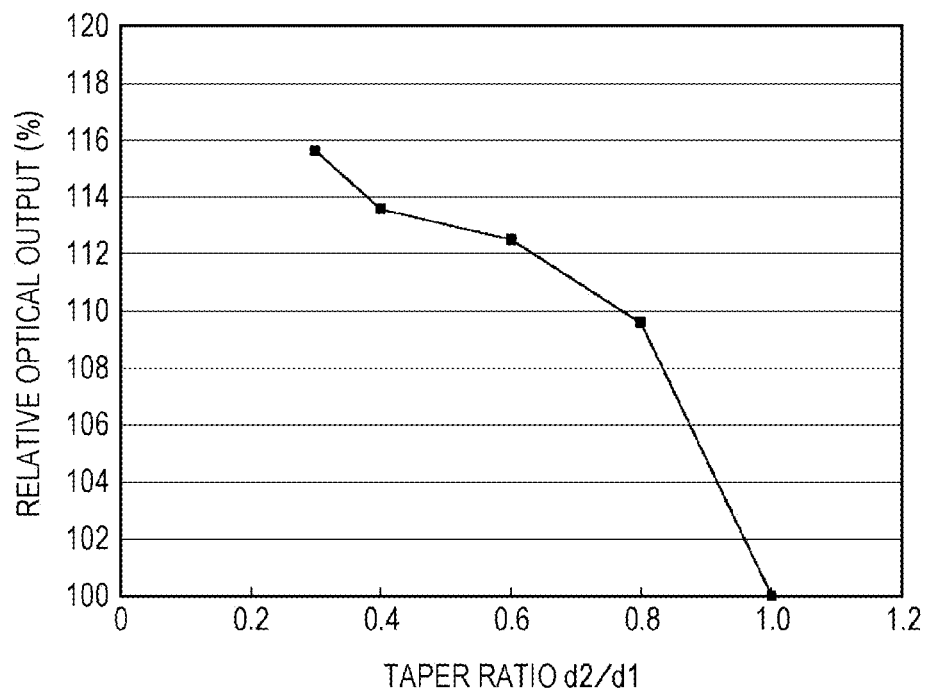
FIG. 14 is a graph showing an analysis result in example 3.

FIG. 14 is a graph that represents the relationship between the taper ratio and the relative optical output. In this graph, the optical output is plotted for each taper ratio by assuming that the optical output when d1 is the same as d2 (that is, the taper ratio d2/d1=1) is 100%. As is apparent from FIG. 14, the optical output was increased as the taper ratio was smaller and the side surface of the wavelength conversion section 64 was slanted toward the front side. A part of light distributed by phosphor particles in the wavelength conversion section 64 is directed to the side surface of the wavelength conversion section 64. As the slant of the side surface of the wavelength conversion section 64 is larger, the effect of reflecting incident light to the front becomes larger. Accordingly, it is thought that extraction of light from the inside of the wavelength conversion section 64 was increased. As described above, if the side surface of the wavelength conversion section 54 is tapered, the optical output can be improved.

Example 4

Figure 22:
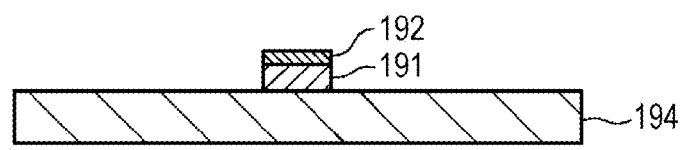
FIG. 22 is a diagram schematically showing the structure of a wavelength conversion member in example 4.

Example 4 will be described below. FIG. 22 is a diagram schematically showing the structure of a wavelength conversion member according to example 4. The wavelength conversion member according to example 4 includes a heat conducting layer 194 that is a transparent heat bath in a visible light region and a wavelength conversion layer provided on the heat conducting layer 194 and the wavelength conversion layer includes a sapphire single crystal substrate 191 and a phosphor layer 192 provided on the sapphire single crystal substrate 191. The phosphor layer 192 uses $Y_3Al_5O_{12}$:Ce (referred to below as YAG) as the phosphor and uses glass as the binder. The phosphor layer 192 is a rectangular parallelepiped that is 0.4 mm high, 0.8 mm wide, and 0.1 mm thick and has a volume of 0.032 $mm^3$. The front surface of the phosphor layer 192 is a rectangle that is 0.4 mm high and 0.8 mm wide and has an area of 0.32 $mm^2$. The phosphor layer 192 has a thermal conductivity of 7.75 W/(m·K), a radiation rate of 0.9, and a thermal transfer coefficient of $1\times10^{-5}$ W/($mm^{2.\circ}$ C.).

The sapphire single crystal substrate 191 is a rectangular parallelepiped that is 0.4 mm high, 0.8 mm wide, 0.33 mm thick and has a volume of approximately 0.11 $mm^3$. The front surface of the sapphire single crystal substrate 191 is a rectangle that is 0.4 mm high and 0.8 mm wide and has an area of 0.32 $mm^2$. The sapphire single crystal substrate 191 has a thermal conductivity of 42 W/(m·K) at 20° C., a thermal conductivity of 25 W/(m·K) at 100° C., a radiation rate of 0.02, and thermal transfer coefficient of $1\times10^{-5}$ w/($mm^{2.\circ}$ C.). The heat conducting layer 194 is a rectangular parallelepiped that is L mm high, L mm wide, and 5 mm thick. The front surface and back surface of the heat conducting layer 194 are squares that are L mm high and L mm wide. The heat conducting layer 194 has a thermal conductivity of 42 W/(m·K), a radiation rate of 0.02, and a thermal transfer coefficient of $1\times10^{-5}$ w/$mm^{2.\circ}$ C.).

Figure 23:
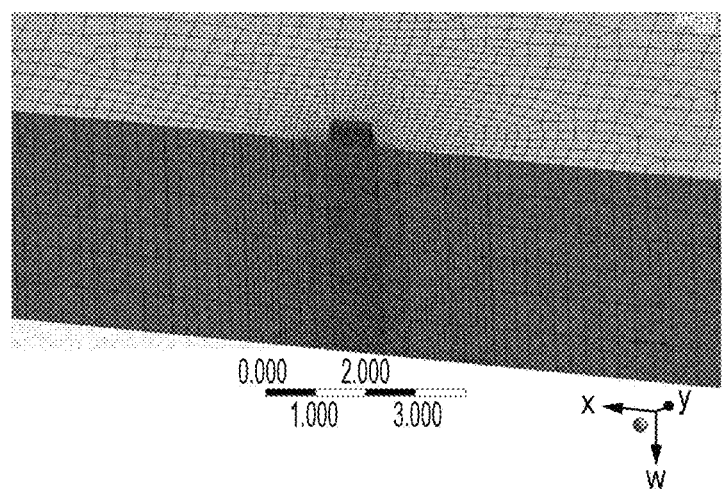
FIG. 23 is a diagram showing an analysis method in example 4.
Figure 24:
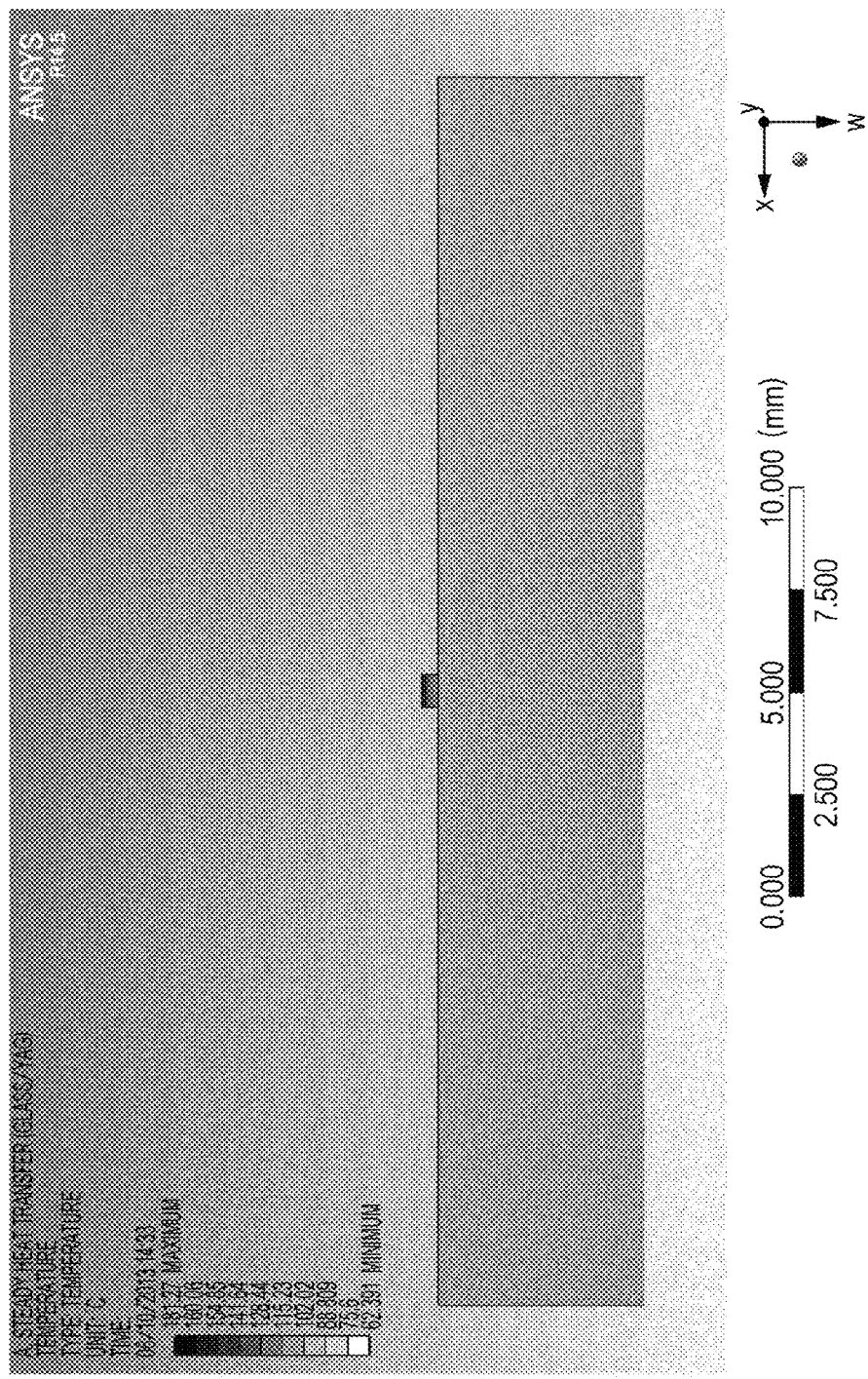
FIG. 24 is a diagram showing an analysis result in example 4.

The thermal characteristics when the wavelength conversion member is irradiated with laser light with an incident power of 5 W from the side of the heat conducting layer 194 were subjected to simulation analysis by changing the height L and width L of the heat conducting layer 194. In this simulation, the nodes on an interface are all shared with a hexagonal mesh (see FIG. 23). As shown in FIG. 24, heat spreads peripherally from the portion irradiated with a semiconductor light emitting device.

Figure 25:
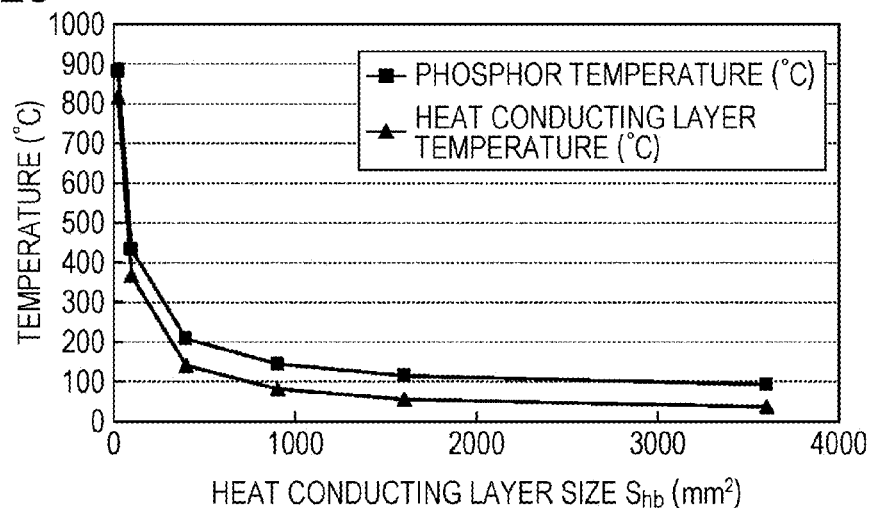
FIG. 25 is a graph showing the relationship between the size and temperature of a heat conducting layer in example 4.

FIG. 25 is a graph that represents the relationship between the size and the temperature of the heat conducting layer 194. When the front surface size of the heat conducting layer 194 is 25, 100, 400, 900, 1600, and 3600 $mm^2$, the temperature of the phosphor layer 192 is 881° C., 433° C., 208° C., 145° C., 115° C., and 93° C., respectively. When the front surface size of the heat conducting layer 194 is 25, 100, 400, 900, 1600, and 3600 $mm^2$, the temperature of the heat conducting layer 194 is 815° C., 367° C., 140° C., 81° C., 57° C., and 38° C., respectively. If the front surface size of the heat conducting layer 194 is 900 $mm^2$ or more, the temperatures of the phosphor layer 192 and the heat conducting layer 194 can be lowered significantly.

Figure 26:
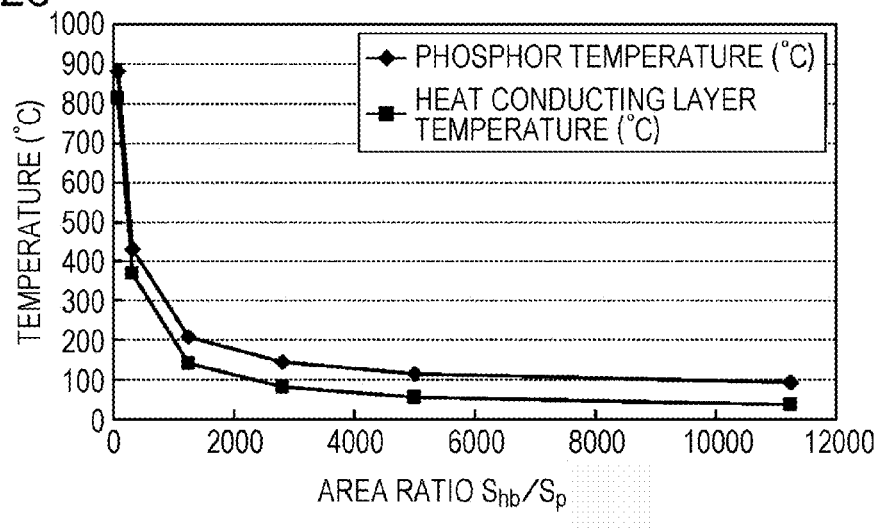
FIG. 26 is a graph showing the relationship between the ratio of the areas of the heat conducting layer and a phosphor layer in example 4 and the temperature.

FIG. 26 is a graph that represents the relationship between the area ratio of the heat conducting layer 194 to the phosphor layer 192 and their temperatures. The value $S_{hb}/S_p$ obtained by dividing the front surface size of the heat conducting layer 194 by the front surface size of the phosphor layer 192 is 78, 313, 1250, 2813, 5000, and 11250, the temperature of the phosphor layer 192 is 881° C., 433° C., 208° C., 145° C., 115° C., and 93° C., respectively. When $S_{hb}/S_p$ is 78, 313, 1250, 2813, 5000, and 11250, the temperature of the heat conducting layer 194 is 815° C., 367° C., 140° C., 81° C., 57° C., and 38° C., respectively. If $S_{hb}/S_p$ is 2800 or more, the temperatures of the phosphor layer 192 and the heat conducting layer 194 can be lowered significantly.

Example 5

Figure 27:
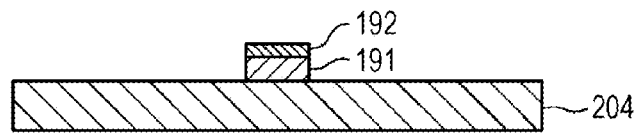
FIG. 27 is a diagram schematically showing the structure of a wavelength conversion member in example 5.

FIG. 27 is a diagram schematically showing the structure of a wavelength conversion member in example 5. The same components as in the fourth embodiment are given the same reference numerals. The wavelength conversion member in example 5 includes a heat conducting layer 204 that is a heat bath made of Al and a wavelength conversion layer provided on the heat conducting layer 204. The wavelength conversion layer includes the sapphire single crystal substrate 191 and the phosphor layer 192 that is a phosphor layer provided on the sapphire single crystal substrate 191. The heat conducting layer 204 is a rectangular parallelepiped that is L mm high, L mm wide, and 5 mm thick. The front surface and back surface of the heat conducting layer 204 are squares that are L mm high and L mm wide. The heat conducting layer 204 has a thermal conductivity of 237.5 W/(m·K), a radiation rate of 0.7, and a thermal transfer coefficient of $1 \times 10^{-5}$ W/(mm$^2$·° C.).

The thermal characteristics when the wavelength conversion member is irradiated with laser light with an incident power of 5 W from the side of the phosphor layer 192 were subjected to simulation analysis by changing the height L and width L of the heat conducting layer 204.

Figure 28:
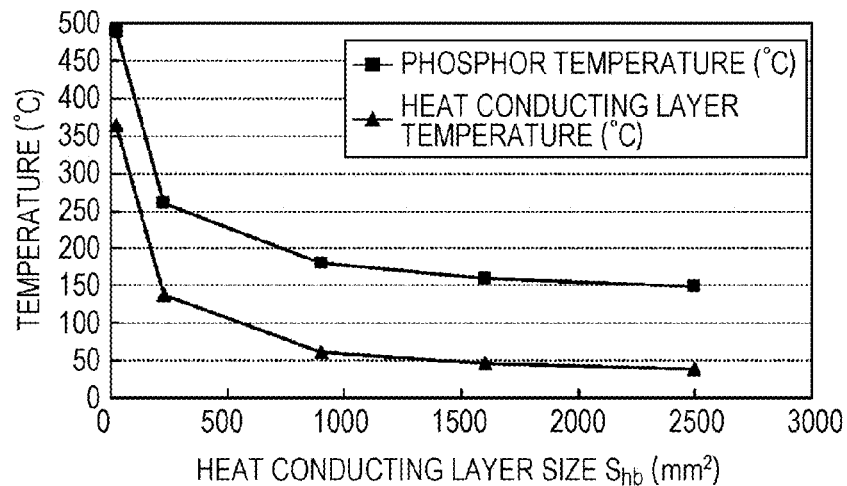
FIG. 28 is a graph showing the relationship between the size and temperature of a heat conducting layer in example 5.

FIG. 28 is a graph that represents the relationship between the size and the temperature of the heat conducting layer 204. When the front surface size $S_{hb}$ of the heat conducting layer 204 is 25, 225, 900, 1600, and 2500 mm$^2$, the temperature of the phosphor layer 192 is 488° C., 260° C., 181° C., 160° C., and 149° C., respectively. When the front surface size $S_{hb}$ of the heat conducting layer 194 is 25, 225, 900, 1600, and 2500 mm$^2$, the temperature of the heat conducting layer 204 is 365° C., 137° C., 62° C., 47° C., and 39° C., respectively. If the front surface size of the heat conducting layer 204 is 225 mm$^2$ or more, the temperatures of the phosphor layer 192 and the heat conducting layer 204 can be lowered significantly.

Figure 29:
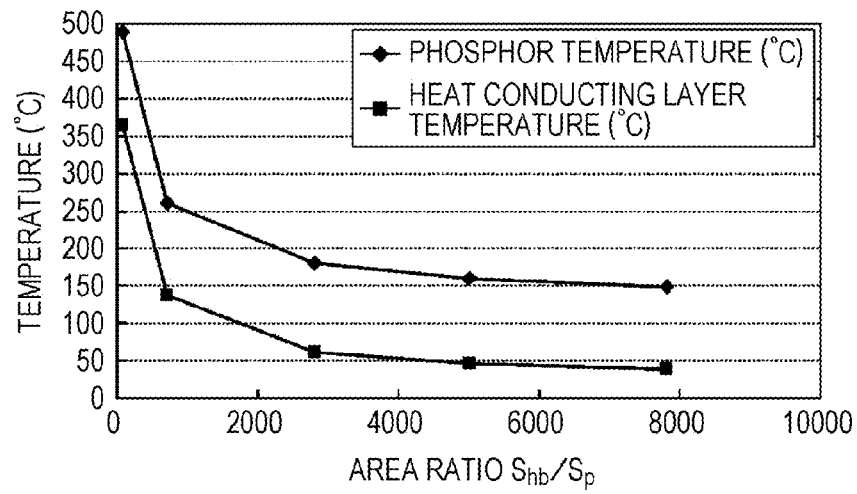
FIG. 29 is a graph showing the relationship between the ratio of the areas of the heat conducting layer and a phosphor layer in example 5 and the temperature.

FIG. 29 is a graph that represents the relationship between the area ratio of the heat conducting layer 204 to the phosphor layer 192 and their temperatures. The value $S_{hb}/S_p$ obtained by dividing the front surface size of the heat conducting layer 204 by the front surface size of the phosphor layer 192 is 78, 703, 2813, 5000, and 7813, the temperature of the phosphor layer 192 is 488° C., 260° C., 181° C., 160° C., and 149° C., respectively. When $S_{hb}/S_p$ is 78, 703, 2813, 5000, and 7813, the temperature of the heat conducting layer 204 is 365° C., 137° C., 62° C., 47° C., and 39° C., respectively. If $S_{hb}/S_p$ is 700 or more, the temperatures of the phosphor layer 192 and the heat conducting layer 204 can be lowered significantly.

Example 6

Figure 30:
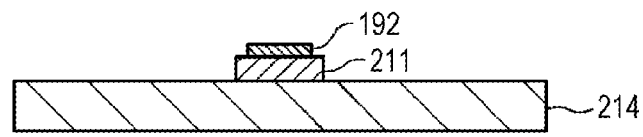
FIG. 30 is a diagram schematically showing the structure of a wavelength conversion member in example 6.

FIG. 30 is a diagram schematically showing the structure of a wavelength conversion member in example 6. The same components as in example 5 are given the same reference numerals. The wavelength conversion member in example 6 includes a heat conducting layer 214 that is a heat bath made of Al and a wavelength conversion layer provided on the heat conducting layer 214. The wavelength conversion layer includes the sapphire substrate 211 and the phosphor layer 192 that is a phosphor layer provided on the sapphire substrate 211.

The sapphire substrate 211 is a rectangular parallelepiped that is L mm high, L mm wide, and 0.33 mm thick. The front surface of the sapphire substrate 211 is a square that is L mm high and L mm wide and has an area of L$^2$ mm$^2$. The sapphire substrate 211 has a thermal conductivity of 42 W/(m·K) at 20° C., a thermal conductivity of 25 W/(m·K) at 100° C., a radiation rate of 0.02, and thermal transfer coefficient of $1 \times 10^{-5}$ w/(mm$^2$·° C.). The heat conducting layer 214 is a rectangular parallelepiped that is 30 mm high, 30 mm wide, and 5 mm thick. The front surface and back surface of the heat conducting layer 214 are squares that are 30 mm high and 30 mm wide. The heat conducting layer 214 has a thermal conductivity of 237.5 W/(m·K), a radiation rate of 0.7, and a thermal transfer coefficient of $1 \times 10^{-5}$ w/mm$^2$·° C.).

Figure 31:
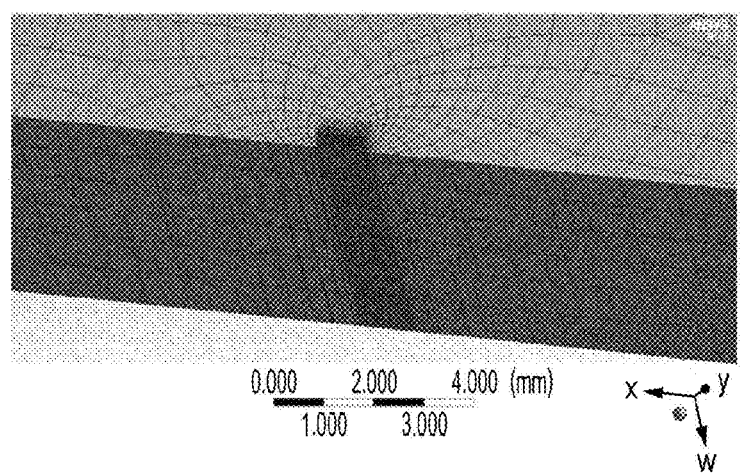
FIG. 31 is a diagram showing an analysis method in example 6.
Figure 32:
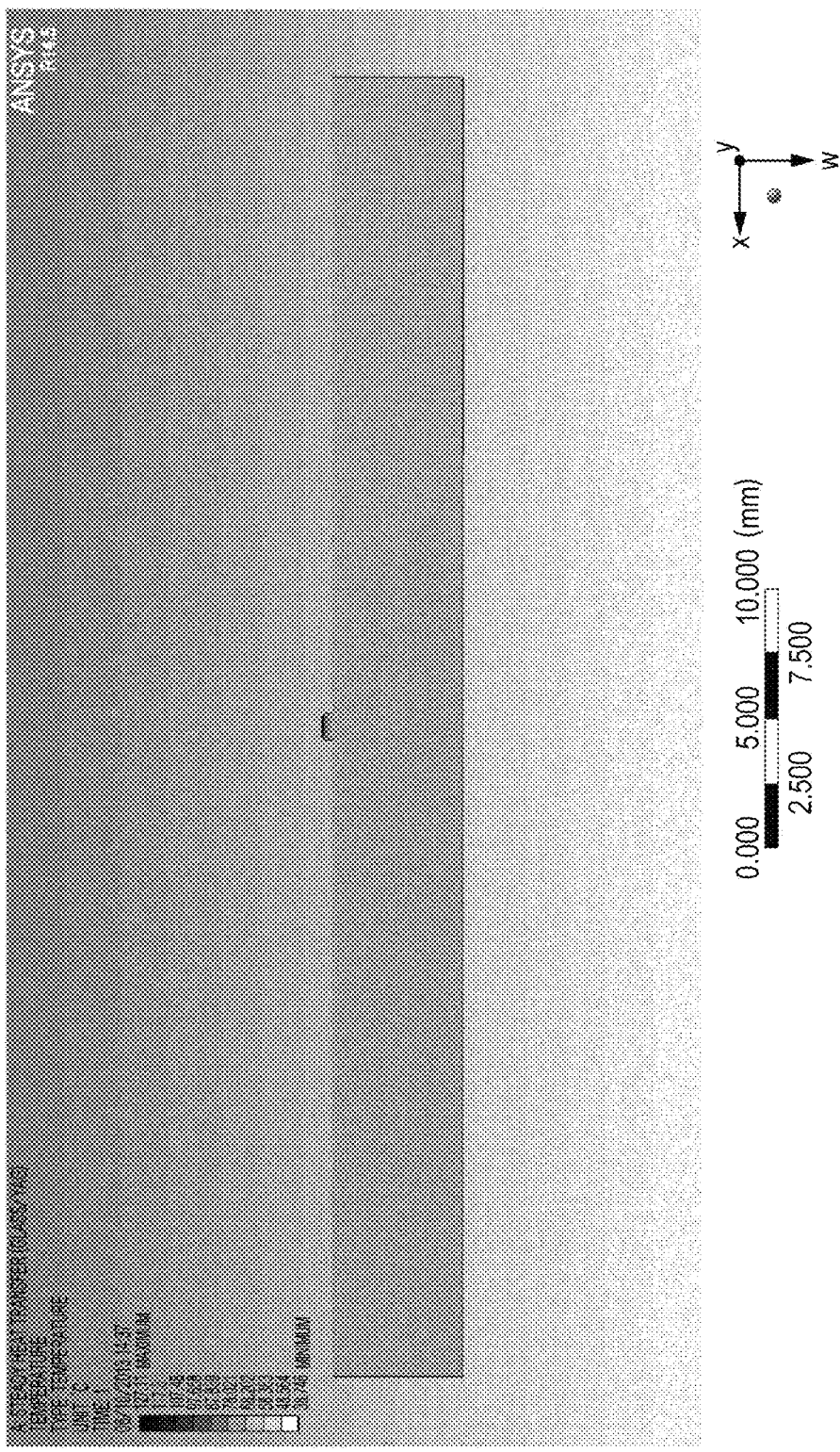
FIG. 32 is a diagram showing an analysis result in example 6.

The thermal characteristics when the wavelength conversion member is irradiated with laser light with an incident power of 5 W from the side of the phosphor layer 192 were subjected to simulation analysis by changing the height L and width L of the sapphire substrate 211. In this simulation, the nodes on an interface are all shared with a hexagonal mesh (see FIG. 31). As shown in FIG. 32, heat spreads peripherally from the portion irradiated with a semiconductor light emitting device.

Figure 33:
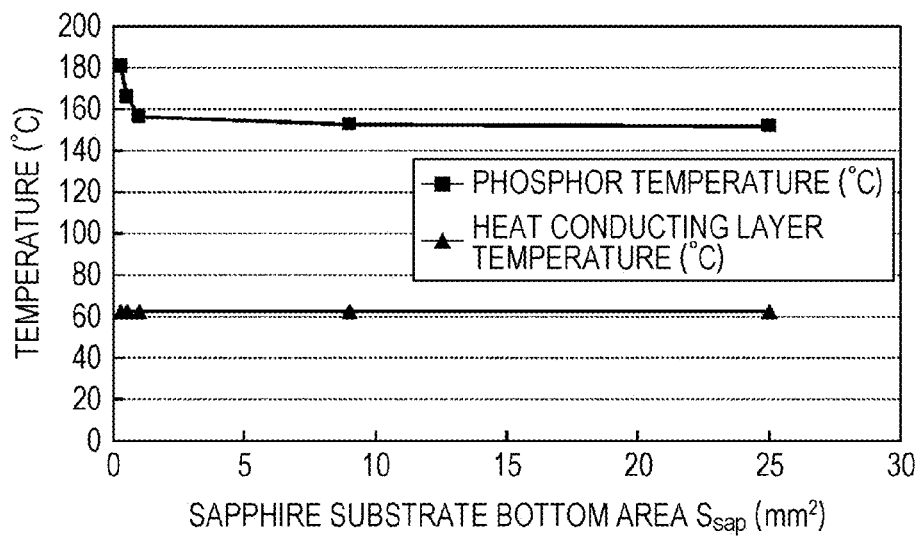
FIG. 33 is a graph showing the relationship between the size and temperature of a sapphire substrate in example 6.

FIG. 33 is a graph that represents the relationship between the size and the temperature of the sapphire substrate 211. When the front surface size of the sapphire substrate 211 is 0.32, 0.5, 1, 9, and 25 mm$^2$, the temperature of the phosphor layer 192 is 181° C., 166° C., 156° C., 153° C., and 152° C., respectively. When the front surface size of the sapphire substrate 211 is 0.32, 0.5, 1, 9, and 25 mm$^2$, the temperature of the heat conducting layer 214 is 62° C. for all sizes. If the front surface size of the sapphire substrate 211 is 1 mm$^2$ or more, the temperature of the phosphor layer 192 can be lowered significantly.

Figure 34:
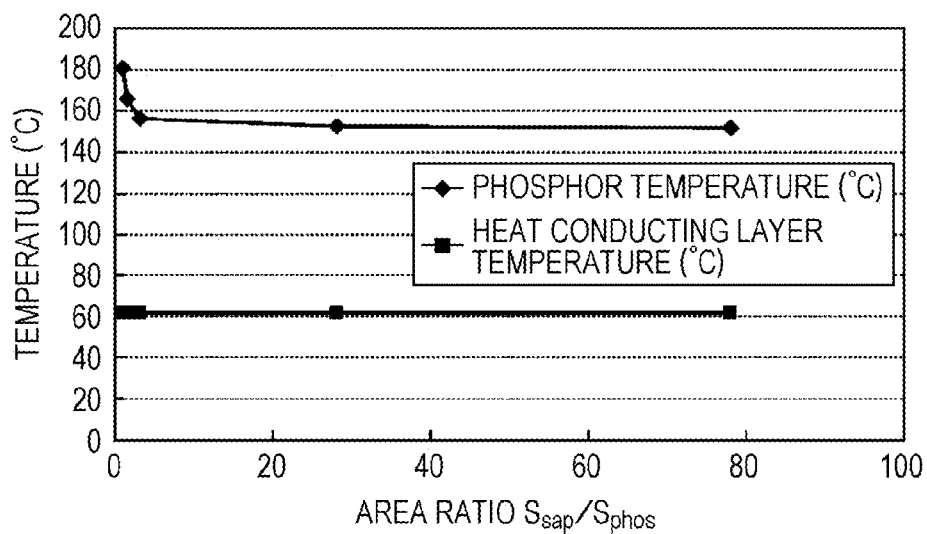
FIG. 34 is a graph showing the relationship between the ratio of the areas of the heat conducting layer and the sapphire substrate in example 6 and the temperature.

FIG. 34 is a graph that represents the relationship between the area ratio $S_{sap}/S_{phos}$ of the phosphor layer 192 to the sapphire substrate 211 and their temperatures. When $S_{sap}/S_{phos}$ is 1.0, 1.6, 3.1, 28.1, and 78.1, the temperature of the phosphor layer 192 is 181° C., 166° C., 156° C., 153° C., and 152° C., respectively. When $S_{sap}/S_{phos}$ is 1.0, 1.6, 3.1, 28.1, and 78.1, the temperature of the heat conducting layer 214 is 62° C. for all area ratios. If $S_{sap}/S_{phos}$ is 3.1 or more, the temperature of the phosphor layer 192 can be lowered significantly.

The wavelength conversion member according to the present disclosure is applicable to, for example, light sources such as special illumination, a head-up display, a projector, and a vehicle head lamp.

What is claimed is:
1. A wavelength conversion member comprising:
a heat conducting layer having a first surface and a second surface opposite to the first surface;
a sapphire substrate having a third surface and a fourth surface opposite to the third surface, the third surface being in direct contact with the second surface of the heat conducting layer; and
a phosphor layer having a fifth surface and a sixth surface opposite to the fifth surface, the fifth surface being in direct contact with the fourth surface of the sapphire substrate, the phosphor layer including phosphor that converts first light having a first wavelength into second light having a second wavelength longer than the first wavelength, wherein:

at least one of an area of the first surface and an area of the second surface of the heat conducting layer is at least 2800 times as large as an area of the sixth surface of the phosphor layer, and at least one of an area of the third surface and an area of the fourth surface of the sapphire substrate is at least two times as large as the area of the sixth surface of the phosphor layer.

2. The wavelength conversion member according to claim 1, wherein at least one of the area of the third surface and the area of the fourth surface of the sapphire substrate is at least 3.1 times as large as the area of the sixth surface of the phosphor layer.

3. The wavelength conversion member according to claim 1, wherein at least one of the area of the first surface and the area of the second surface of the heat conducting layer is at least 8000 times as large as the area of the sixth surface of the phosphor layer.

4. The wavelength conversion member according to claim 1, wherein the phosphor layer does not include a resin binder.

5. The wavelength conversion member according to claim 1, wherein the heat conducting layer is transparent in a visible light region and has a thermal conductivity of 30 W/(m·K) or more.

6. The wavelength conversion member according to claim 1, wherein the heat conducting layer has a thermal conductivity of 42 W/(m·K) or more.

7. The wavelength conversion member according to claim 1, wherein the heat conducting layer has a thermal conductivity of 230 W/(m·K) or more.

8. The wavelength conversion member according to claim 1, wherein:

the phosphor layer comprises glass or a transparent crystal, and the phosphor is distributed in the glass or in the transparent crystal.

9. The wavelength conversion member according to claim 1, wherein the sapphire substrate is a sapphire single-crystal substrate.

10. The wavelength conversion member according to claim 1, wherein the heat conducting layer is a reflecting body with respect to visible light and has a thermal conductivity of 237.5 W/(m·K) or more.

11. A light source comprising:
a semiconductor light emitting device for emitting first light having a first wavelength; and
a wavelength conversion member,
wherein the wavelength conversion member comprises:
a heat conducting layer having a first surface and a second surface opposite to the first surface;
a sapphire substrate having a third surface and a fourth surface opposite to the third surface, the third surface being in direct contact with the second surface of the heat conducting layer; and
a phosphor layer having a fifth surface and a sixth surface opposite to the fifth surface, the fifth surface being in direct contact with the fourth surface of the sapphire substrate, the phosphor layer including phosphor that converts the first light into second light having a second wavelength longer than the first wavelength, wherein:

at least one of an area of the first surface and an area of the second surface of the heat conducting layer is at least 2800 times as large as an area of the sixth surface of the phosphor layer, and at least one of an area of the third surface and an area of the fourth surface of the sapphire substrate is at least two times as large as the area of the sixth surface of the phosphor layer.

12. A vehicle head lamp comprising:
a semiconductor light emitting device for emitting first light having a first wavelength;
a wavelength conversion member; and
a mirror for reflecting at least second light having a second wavelength longer than the first wavelength,
wherein the wavelength conversion member comprises:
a heat conducting layer having a first surface and a second surface opposite to the first surface;
a sapphire substrate having a third surface and a fourth surface opposite to the third surface, the third surface being in direct contact with the second surface of the heat conducting layer; and
a phosphor layer having a fifth surface and a sixth surface opposite to the fifth surface, the fifth surface being in direct contact with the fourth surface of the sapphire substrate, the phosphor layer including phosphor that converts the first light into the second light having a second wavelength longer than the first wavelength, wherein:

at least one of an area of the first surface and an area of the second surface of the heat conducting layer is at least 2800 times as large as an area of the sixth surface of the phosphor layer, and at least one of an area of the third surface and an area of the fourth surface of the sapphire substrate is at least two times as large as the area of the sixth surface of the phosphor layer.

* * * * *